(12) United States Patent
Mihashi et al.

(10) Patent No.: US 10,951,115 B2
(45) Date of Patent: Mar. 16, 2021

(54) SWITCHING REGULATOR

(71) Applicant: PANASONIC INTELLECTUAL PROPERTY MANAGEMENT CO., LTD., Osaka (JP)

(72) Inventors: Tetsuya Mihashi, Kyoto (JP); Junji Ishiyama, Osaka (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 252 days.

(21) Appl. No.: 16/255,319

(22) Filed: Jan. 23, 2019

(65) Prior Publication Data

US 2019/0157973 A1 May 23, 2019

Related U.S. Application Data

(63) Continuation of application No. PCT/JP2017/026421, filed on Jul. 21, 2017.

(30) Foreign Application Priority Data

Jul. 29, 2016 (JP) .............................. JP2016-150342

(51) Int. Cl.
*H02M 3/155* (2006.01)
*H02M 3/156* (2006.01)
(Continued)

(52) U.S. Cl.
CPC ............. *H02M 3/155* (2013.01); *H02M 1/08* (2013.01); *H02M 1/14* (2013.01); *H02M 3/156* (2013.01); *H03F 3/45475* (2013.01)

(58) Field of Classification Search
None
See application file for complete search history.

(56) References Cited

U.S. PATENT DOCUMENTS 7,279,875 B2 * 10/2007 Gan .................... H02M 3/1588
323/282
8,138,739 B1    3/2012 Eirea et al.
(Continued)

FOREIGN PATENT DOCUMENTS

JP    2007-089278 A    4/2007

OTHER PUBLICATIONS

International Search Report and Written Opinion issued in International Patent Application No. PCT/JP2017/026421, dated Aug. 15, 2017; with partial English translation.

*Primary Examiner* — Jeffery S Zweizig
(74) *Attorney, Agent, or Firm* — McDermott Will and Emery LLP

(57) ABSTRACT

A switching regulator includes a switch device that is connected between an input terminal to which an input DC voltage is applied and an output terminal from which an output DC voltage is output, and that is turned on and off according to a drive signal; a hysteresis generation circuit to which the input DC voltage and the output DC voltage are applied; a reference voltage generation circuit that generates a reference voltage having a gradient proportional to an output current or an output voltage; and a drive signal generation circuit that generates the drive signal by comparing the output DC voltage with the reference voltage, and that, where the hysteresis generation circuit generates the output current or the output voltage that is inversely proportional to a differential voltage between the input DC voltage and the output DC voltage.

13 Claims, 20 Drawing Sheets

(51) Int. Cl.
*H02M 1/08* (2006.01)
*H02M 1/14* (2006.01)
H03F 3/45 (2006.01)

(56) References Cited

U.S. PATENT DOCUMENTS

| | | | |
|---|---|---|---|
| 8,164,391 B2 * | 4/2012 | Huynh | ................. H03L 7/0893 331/34 |
| 2007/0063685 A1 | 3/2007 | Ishii et al. | |
| 2012/0025919 A1 | 2/2012 | Huynh | |

* cited by examiner

SWITCHING REGULATOR

CROSS REFERENCE TO RELATED APPLICATIONS

This application is a U.S. continuation application of PCT International Patent Application Number PCT/JP2017/026421 filed on Jul. 21, 2017, claiming the benefit of priority of Japanese Patent Application Number 2016-150342 filed on Jul. 29, 2016, the entire contents of which are hereby incorporated by reference.

BACKGROUND

1. Technical Field

The present disclosure relates to a hysteretic switching regulator that converts an input DC voltage to an output DC voltage.

2. Description of the Related Art

A switching regulator is often used as a power supply device for converting an input DC voltage from a battery or the like to a stabilization-controlled output DC voltage. These days, a technique called hysteresis control, which achieves superior transient response characteristics, is known as a control method of the switching regulator (see Japanese Unexamined Patent Application Publication No. 2007-89278, for example). The hysteresis control is a self-excitation method of keeping an output DC voltage within a hysteresis width set by a hysteresis comparison circuit, and does not include a feedback system that uses a general error amplifier. A transient response time is limited only by a delay time of the hysteresis comparison circuit and a drive circuit of a switch device.

In Japanese Unexamined Patent Application Publication No. 2007-89278, the hysteresis width is provided on the side of a reference voltage with which the output DC voltage is compared, and thus, a hysteresis width at the output DC voltage, or in other words, an output ripple voltage, is reduced.

SUMMARY

Such a hysteresis-controlled switching regulator is capable of swiftly responding to a sudden change in a load and of stabilizing the output DC voltage, and is used mainly as a CPU power supply for a portable terminal appliance, a personal computer (PC), or a server. Presently, application to a vehicle-mounted microcomputer power supply is further anticipated.

With respect to a vehicle-mounted microcomputer, current consumption is increasing year by year due to an increase in performance brought about by development of safety functions of vehicles. High-speed transient response performance is required, which is capable of suppressing fluctuations in the output DC voltage even when a current is suddenly changed at a time of the vehicle-mounted microcomputer shifting from a standby state to a full-operation state.

A vehicle-mounted microcomputer power supply takes a 12V vehicle-mounted battery as an input source, for example, and a wide input voltage range from a low voltage of about 6V to about 16V is required for a battery voltage to cope with a drop in the voltage caused by supply of a large current at the time of start of an engine.

Furthermore, the vehicle-mounted microcomputer power supply is required to be capable of suppressing or controlling fluctuations in switching frequency so as to avoid interference with radio frequency. In Japanese Unexamined Patent Application Publication No. 2007-89278, the hysteresis width has to be adjusted to suppress fluctuations in the switching frequency caused by the input DC voltage. Moreover, there is a problem that suppression of frequency fluctuations, including fluctuations in the output DC voltage, is difficult to control because control is complicated.

The present disclosure has its object to provide a switching regulator adopting hysteresis control which achieves superior high-speed responsiveness, the switching regulator being capable of suppressing fluctuations in switching frequency with respect to a wide input/output voltage range.

A switching regulator according to an aspect of the present disclosure includes a switch device that is connected between an input terminal to which an input DC voltage is applied, and an output terminal from which an output DC voltage is output, and that is turned on and off according to a drive signal; a hysteresis generation circuit to which the input DC voltage and the output DC voltage are applied, and that generates an output current according to the input DC voltage and the output DC voltage; a reference voltage generation circuit that generates a reference voltage having a gradient proportional to the output current; and a drive signal generation circuit that generates the drive signal by comparing the output DC voltage with the reference voltage.

According to such a configuration, fluctuations in a switching cycle or an amplitude of the reference voltage caused by fluctuations in the input DC voltage and the output DC voltage may be suppressed. The switching regulator may thereby dynamically cope with a change in a wide input/output voltage range. For example, stable operation may be performed even in case of a voltage reduction which is temporarily caused by an increase in a load on a battery during driving of a motor or the like, or in case of an overvoltage which is transiently caused when a battery comes off due to some factor during operation of an engine.

For example, the drive signal generation circuit may include a comparator that compares the output DC voltage with the reference voltage, a timer circuit that measures a time length that is proportional to the output DC voltage and inversely proportional to the input DC voltage, from when an output signal of the comparator is inverted, and a switch control circuit that generates the drive signal that turns on the switch device in a period from when the output signal of the comparator is inverted to when the time length elapses.

According to such a configuration, an on time of the switch device is appropriately adjusted with respect to fluctuations in the input DC voltage and the output DC voltage, and thus, fluctuations in the switching cycle may be suppressed.

For example, the hysteresis generation circuit may include a current multiplier that generates, in an off period of the switch device, the output current that is proportional to ratio value (Vi/(Vi−Vo)) of input DC voltage Vi and difference (Vi−Vo) between input DC voltage Vi and output DC voltage Vo.

For example, the hysteresis generation circuit may further include a capacitor that is charged with an output current of the current multiplier, and a switch that discharges a voltage of the capacitor according to the drive signal.

For example, the reference voltage generation circuit may include a reference voltage source, a first resistor that is connected to the reference voltage source, and a voltage current converter that converts the voltage of the capacitor of the hysteresis generation circuit into a current, and that supplies the current to the first resistor.

For example, the current multiplier of the hysteresis generation circuit may further generate, in an on period of the switch device, the output current that is proportional to ratio value (Vi/Vo) of input DC voltage Vi and output DC voltage Vo.

According to such a configuration, fluctuations in an amplitude of the reference voltage may be suppressed even in the case of changing the reference voltage, in both the on period and the off period of the switch device.

For example, the switch control circuit may generate the drive signal that turns on the switch device during a period from when an output signal of the comparator is inverted, to a later one of (1) when a time length elapses at the timer circuit, and (2) when the output signal of the comparator is inverted again, and with the hysteresis generation circuit, the output current of the multiplier in a first on period from when the output signal is inverted to when the time length elapses may be higher than the output current of the multiplier in a second on period from when the time length elapses to when the output signal of the comparator is inverted again.

According to such a configuration, an increase in the amplitude of the reference voltage in a case where the on period of the switch device is long may be suppressed.

For example, the switching regulator may further include an amplifier that amplifies and converts a differential voltage between a voltage of the reference voltage source and the output DC voltage into a current, where an output current of the amplifier is supplied to the first resistor of the reference voltage generation circuit.

According to such a configuration, an offset voltage that is caused before and after reset of the switch may be cancelled, and fluctuations in the output voltage may be suppressed.

For example, the switching regulator may include a voltage current converter that amplifies and converts a differential voltage between a voltage of the reference voltage source and the output DC voltage into a current, and that includes a first current output terminal and a second current output terminal that output currents of different polarities, and a second resistor that is connected between the output terminal of the switching regulator and a second input terminal of the comparator of the drive signal generation circuit, and the switching regulator may be configured to supply a current from the first current output terminal of the voltage current converter to the first resistor, and to supply a current from the second current output terminal of the voltage current converter to the second resistor.

According to such a configuration, the amplitude of the reference voltage may be reduced without reducing the offset voltage that is caused before and after reset of the switch, and insufficiency in an input dynamic range caused by reduction in a power supply voltage may be overcome.

The reference voltage generation circuit may include a second resistor that is connected between the output terminal of the switching regulator and a second input terminal of the comparator of the drive signal generation circuit, the voltage current converter may include a first current output terminal and a second current output terminal that output currents of different polarities, and the switching regulator may be configured to supply a current from the first current output terminal of the voltage current converter to the first resistor, and to supply a current from the second current output terminal of the voltage current converter to the second resistor.

According to such a configuration, stable operation may be realized even in a case where an input dynamic range of the comparator is reduced, by reducing a voltage amplitude of the reference voltage. This is particularly advantageous in the case of low-voltage operation.

For example, the switching regulator may be partly or wholly implemented as an integrated circuit.

For example, the switching regulator may be for being mounted on a vehicle.

These comprehensive or specific aspects may be implemented by a system, a method, or an integrated circuit, or may be implemented by any combination of the system, the method, and the integrated circuit.

According to the present disclosure, a switching regulator that swiftly copes with wide fluctuations in input/output voltage may be provided.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Hereinafter, embodiments will be specifically described with reference to the drawings. The embodiments described below are specific examples of the present disclosure. Numerical values, shapes, materials, structural elements, arrangement and connection modes of the structural elements, steps, the order of steps, and the like indicated in the following embodiments are merely examples, and are not intended to limit the present disclosure. Of the structural elements in the following embodiments, structural elements not described in an independent claim indicating a broadest concept are described as arbitrary structural elements.

Embodiment 1

Figure 1:
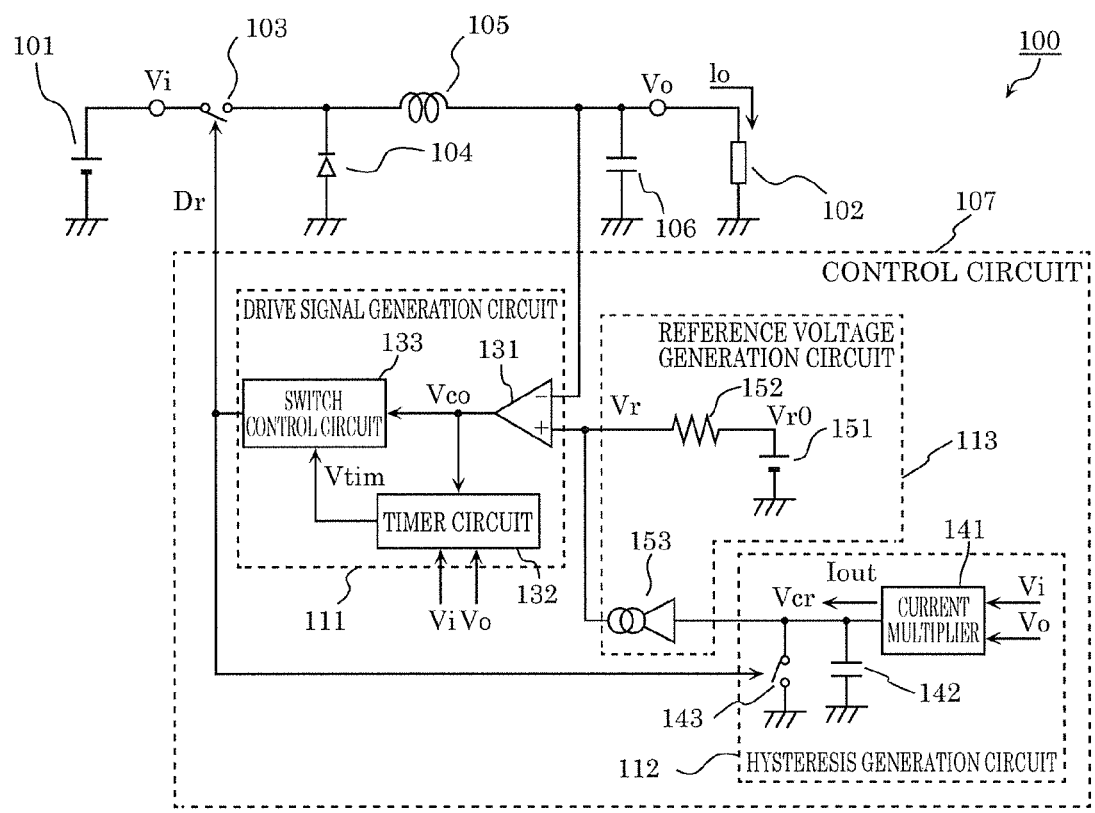
FIG. 1 is a configuration diagram of a switching regulator according to Embodiment 1.

FIG. 1 is a configuration diagram of switching regulator 100 according to Embodiment 1, and input DC voltage Vi input to input terminal from DC voltage source 101 is stepped down and converted to output DC voltage Vo, and is supplied to load 102 from an output terminal. Additionally, a number is not assigned to the input terminal and the output terminal, and respective voltages Vi, Vo are assigned instead.

Switching regulator 100 according to the present embodiment includes switch device 103, diode 104, inductor 105, output capacitor 106, and control circuit 107.

One end of switch device 103 is connected to input terminal Vi, and a cathode of diode 104 and one end of inductor 105 are connected to the other end. Inductor 105 is connected between switch device 103 and load 102. An anode of diode 104 is grounded, and the other end of inductor 105 is connected to output terminal Vo. Output capacitor 106 is connected to output terminal Vo, in parallel with load 102.

Input DC voltage Vi is intermittently at high frequency due to switch device 103, which is repeatedly turned on/off by drive signal Dr from control circuit 107, and is smoothed by inductor 105 and output capacitor 106, and output DC voltage Vo is thereby supplied to load 102. When switch device 103 is in an off state, diode 104 forms a path allowing a reflux current of inductor 105 to flow to the output, and diode 104 is thus referred to also as a freewheeling diode.

Switching regulator 100 having such a configuration is of a step-down type, and output DC voltage Vo is lower than input DC voltage Vi. When a switching cycle of switch device 103 is given as TSW, an on time as Ton, and a duty ratio as D=Ton/TSW, a relationship between input DC voltage Vi and output DC voltage Vo of the step-down switching regulator is expressed by the following (Equation 1).

$$Vo=D \cdot Vi \quad \text{(Equation 1)}$$

That stabilization control can be performed on output DC voltage Vo by adjusting duty ratio D of switch device 103 by control circuit 107 is indicated by (Equation 1).

In the following, a configuration of control circuit 107 will be described. Control circuit 107 includes drive signal generation circuit 111, hysteresis generation circuit 112, and reference voltage generation circuit 113.

Drive signal generation circuit 111 includes comparator 131, timer circuit 132, and switch control circuit 133, and receives application of input DC voltage Vi and output DC voltage Vo, and of reference voltage Vr from reference voltage generation circuit 113, and generates drive signal Dr. Comparator 131 compares output DC voltage Vo with reference voltage Vr, and outputs output signal Vco indicating the comparison result. Timer circuit 132 measures a time length according to input DC voltage Vi and output DC voltage Vo, from inversion of output signal Vco, and outputs signal Vtim. Switch control circuit 133 generates drive signal Dr that turns on switch device 103 during a period from inversion of output signal Vco to rising of signal Vtim.

Hysteresis generation circuit 112 includes current multiplier 141, capacitor 142, and switch 143. Current multiplier 141 generates output current Iout according to input DC voltage Vi and output DC voltage Vo. Capacitor 142 is connected in parallel with an output terminal of current multiplier 141, and is charged with output current Tout of current multiplier 141. A charging voltage of capacitor 142 is given as voltage Vcr. Switch 143 is connected in parallel with capacitor 142, and is turned on/off according to drive signal Dr. Switch 143 is turned on during a period when switch device 103 is turned on by drive signal Dr, and voltage Vcr of capacitor 142 is thereby reset to a GND level.

Reference voltage generation circuit 113 includes reference voltage source 151, resistor 152, and voltage current converter 153, and generates reference voltage Vr (pseudo ripple voltage) having a gradient proportional to output current Tout of current multiplier 141. Reference voltage source 151 outputs stable DC voltage Vr0. Resistor 152 is connected between reference voltage source 151 and an input terminal of comparator 131 of drive signal generation circuit 111. Voltage current converter 153 outputs a current that is proportional to voltage Vcr from hysteresis generation circuit 112, and supplies the current to reference voltage source 151 through resistor 152. That is, a voltage that is obtained by superimposing a voltage drop at resistor 152 caused by the current from voltage current converter 153, on voltage Vr0 of reference voltage source 151 is applied, as reference voltage Vr, to the input terminal of comparator 131 of drive signal generation circuit 111.

Figure 2:
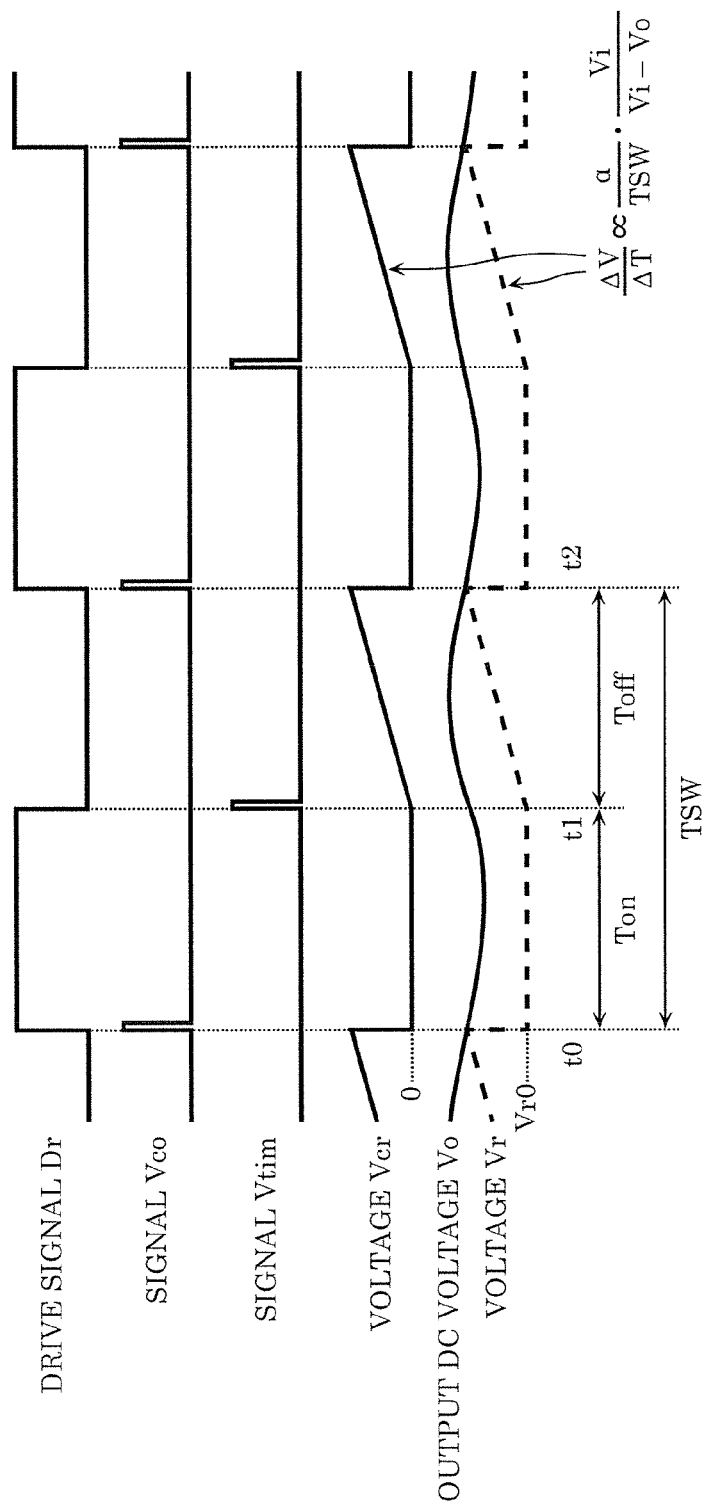
FIG. 2 is a timing chart showing an operation of the switching regulator according to Embodiment 1.

A control operation of switching regulator 100 configured in the above manner will be described below. FIG. 2 is a timing chart showing an operation of switching regulator 100, and shows drive signal Dr, signal Vco, signal Vtim, reference voltage Vr, and output DC voltage Vo.

First, when output DC voltage Vo falls to or below reference voltage Vr at time t0, output signal Vco from comparator 131 rises. Then, switch control circuit 133 raises drive signal Dr, and places switch device 103 in an on state.

When drive signal Dr rises, switch 143 of hysteresis generation circuit 112 is turned on, and capacitor 142 is reset to the GND level. Accordingly, at reference voltage generation circuit 113, current from voltage current converter 153 stops, and the voltage drop at resistor 152 becomes zero, and thus, reference voltage Vr is swiftly lowered to voltage Vr0. As a result, output signal Vco of comparator 131 of drive signal generation circuit 111 is inverted again to be a one-shot pulse as shown in FIG. 2.

When output signal Vco rises, timer circuit 132 measures on time Ton from time t0.

As described above, Ton is an on time of switch device 103 (i.e., high period of drive signal Dr), and the relationship of (Equation 1) is established for duty ratio D=Ton/TSW, which is a ratio of on time Ton to switching cycle TSW, input DC voltage Vi and output DC voltage Vo. Accordingly, switching cycle TSW may be made constant even when input DC voltage Vi and output DC voltage Vo change, due to timer circuit 132 controlling on time Ton in such a way as to satisfy the following (Equation 2).

$$Ton = TSW \cdot Vo/Vi \qquad \text{(Equation 2)}$$

That is, timer circuit 132 measures on time Ton, which is proportional to output DC voltage Vo and inversely proportional to input DC voltage Vi, after output signal Vco is inverted.

Figure 3:
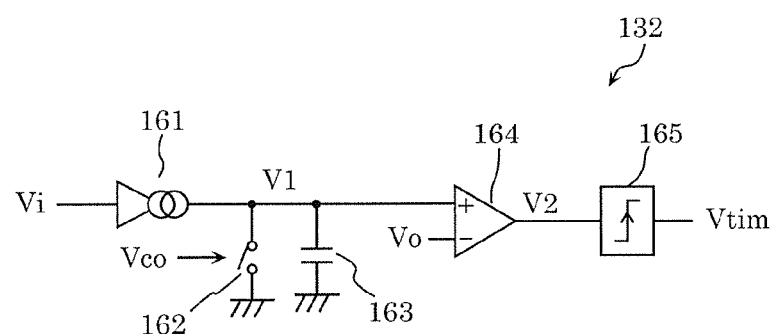
FIG. 3 is a configuration diagram of a timer circuit according to Embodiment 1.

FIG. 3 is a diagram showing an example configuration of timer circuit 132. Timer circuit 132 shown in FIG. 3 includes voltage current converter 161, switch 162, capacitor 163, comparator 164, and edge detection circuit 165.

Voltage current converter 161 outputs a current that is proportional to input DC voltage Vi. Capacitor 163 is connected to an output terminal of voltage current converter 161, and generates voltage V1 by being charged with the current from voltage current converter 161. Switch 162 is connected in parallel with capacitor 163, and on/off of switch 162 is controlled according to signal Vco.

Comparator 164 compares output DC voltage Vo with voltage V1, and outputs signal V2 indicating the comparison result. Edge detection circuit 165 detects a rising edge of signal V2, and generates signal Vtim indicating the detection result.

Figure 4:
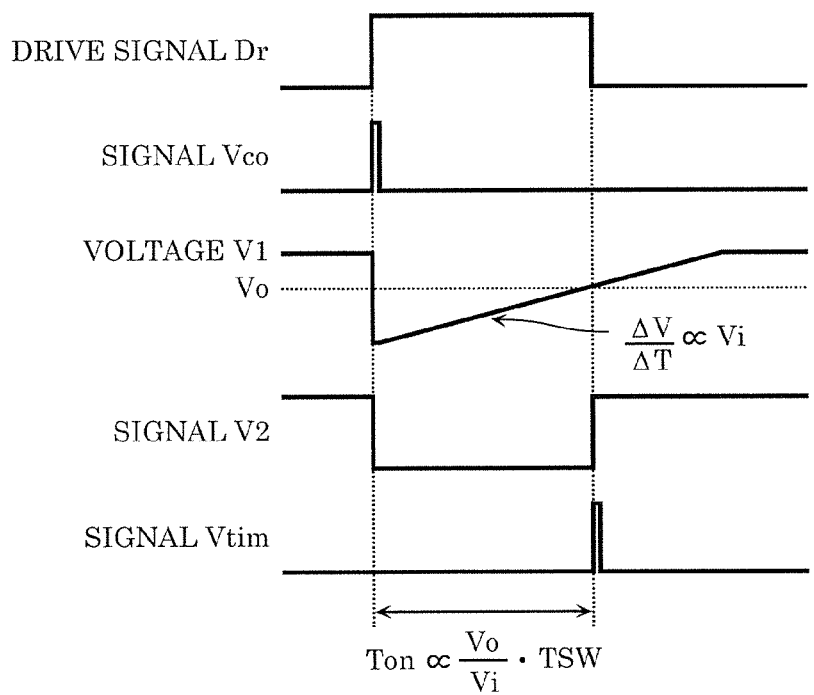
FIG. 4 is a timing chart showing an operation of the timer circuit according to Embodiment 1.

FIG. 4 is a timing chart showing an operation of timer circuit 132, and shows drive signal Dr, signal Vco, voltage V1 and output DC voltage Vo, signal V2, and signal Vtim. First, signal Vco rises, and switch 162 is turned on and voltage V1 is reset to the GND level. Signal Vco is a one-shot pulse, and thus, switch 162 is immediately turned off after resetting of voltage V1.

At the same time as switch 162 is turned off, capacitor 163 is charged with the current from voltage current converter 161, and voltage V1 rises. The current from voltage current converter 161 is proportional to input DC voltage Vi, and a rising speed of voltage V1 is also proportional to input DC voltage Vi. When voltage V1 that is rising becomes higher than output DC voltage Vo, output signal V2 of comparator 164 rises, and edge detection circuit 165 raises one-shot pulse signal Vtim when detecting rising of signal V2.

Rising of signal Vco to rising of signal Vtim corresponds to on time Ton. That is, up to charging of output DC voltage Vo at the rising speed proportional to input DC voltage Vi is on time Ton, and thus, on time Ton is inversely proportional to input DC voltage Vi and proportional to output DC voltage Vo (Ton∝Vo/Vi).

Referring back to FIGS. 1 and 2, a subsequent operation will be described.

When signal Vtim rises at time t1, which is after a lapse of on time Ton from time t0, switch control circuit 133 causes drive signal Dr to fall, and places switch device 103 in an off state.

Switch 143 which is in an on state in the on period (t0 to t1) of drive signal Dr is placed in an off state at the time of fall of drive signal Dr at time t1. Capacitor 142 is thereby charged with output current Iout of current multiplier 141, and voltage Vcr which is reset to the GND level starts to rise. Voltage current converter 153 outputs a current that is proportional to rising voltage Vcr, a voltage drop occurs at resistor 152, and reference voltage Vr starts to rise from voltage Vr0.

At time t2, output DC voltage Vo falls below reference voltage Vr and signal Vco rises, and an operation the same as at time t0 is performed. That is, from time t1 to time t2 is off time Toff of switch device 103. As described above, switch device 103 repeats a switching operation at switching cycle TSW, which is a sum of on time Ton and off time Toff.

From (Equation 2), off time Toff is expressed by the following (Equation 3).

$$Toff = TSW - Ton = TSW \cdot (1 - Vo/Vi) \qquad \text{(Equation 3)}$$

When current multiplier 141 to which input DC voltage Vi and output DC voltage Vo are applied outputs output current Iout which is proportional to Vi/(Vi−Vo), voltage Vcr of capacitor 142 also increases at a gradient proportional to Vi/(Vi−Vo). By converting voltage Vcr into a current by voltage current converter 153, and causing the current to flow through resistor 152, reference voltage Vr is also increased at a gradient proportional to Vi/(Vi−Vo). When α is given as a proportionality constant, gradient ΔV/ΔT of reference voltage Vr is expressed by (Equation 4).

$$\Delta V/\Delta T = (\alpha/TSW) \cdot (Vi/(Vi-Vo)) \qquad \text{(Equation 4)}$$

Amplitude ΔVr of reference voltage Vr is constant α, as given by the following (Equation 5).

$$\begin{aligned} \Delta Vr &= \Delta V / \Delta T \times Toff \\ &= (\alpha/TSW) \cdot (Vi/(Vi-Vo)) \times \\ &\quad TSW \cdot ((Vi-Vo)/Vi) \\ &= \alpha \end{aligned} \qquad \text{(Equation 5)}$$

In Japanese Unexamined Patent Application Publication No. 2007-89278, to suppress fluctuations in the switching cycle, an amplitude, or in other words, a hysteresis width, of a pseudo ripple voltage to be superimposed on a reference voltage has to be adjusted. However, by performing control of the present embodiment, in the theoretical formulae, both switching cycle TSW and amplitude ΔVr of reference voltage Vr may be made constant regardless of input DC voltage Vi and output DC voltage Vo. If fluctuations in switching cycle TSW is suppressed, interference with radio frequency may be suppressed for vehicle-mounting usage in particular. If fluctuations in amplitude ΔVr of reference voltage Vr is suppressed, a margin may be secured with respect to an input dynamic range of comparator 131, for example. That is, switching regulator 100 may cover a wide range of input/output voltage.

Next, an example configuration of a vehicle-mounted power supply system which uses switching regulator 100 of the present embodiment will be described with reference to FIG. 5, in terms of increased voltage of a recent vehicle-mounted battery.

Behind the example configuration, there is a system based on a fuel consumption reduction technology for vehicles, which is being developed in recent years, the system being for increasing a battery voltage from conventional 12V to 48V so as to reduce a drive current (i.e., a so-called 48V system). Due to the battery voltage being increased to a high voltage, a drive current of a motor may be reduced to a quarter, and a necessary wire diameter may be reduced. Accordingly, the motor may be miniaturized and a weight of a wire harness may be reduced, and a lower fuel consumption may be realized. On the other hand, although a drive current is reduced compared with a 12V battery, the motor is connected as a load, and an input voltage fluctuates between 36V and 52V. Moreover, various electronic devices, such as a semiconductor and a capacitor, configuring the system are increased in size to achieve a high breakdown voltage. Accordingly, to enable use of an electronic device with a 12V battery, a power supply device which steps down 48V to 12V becomes necessary.

Figure 5:
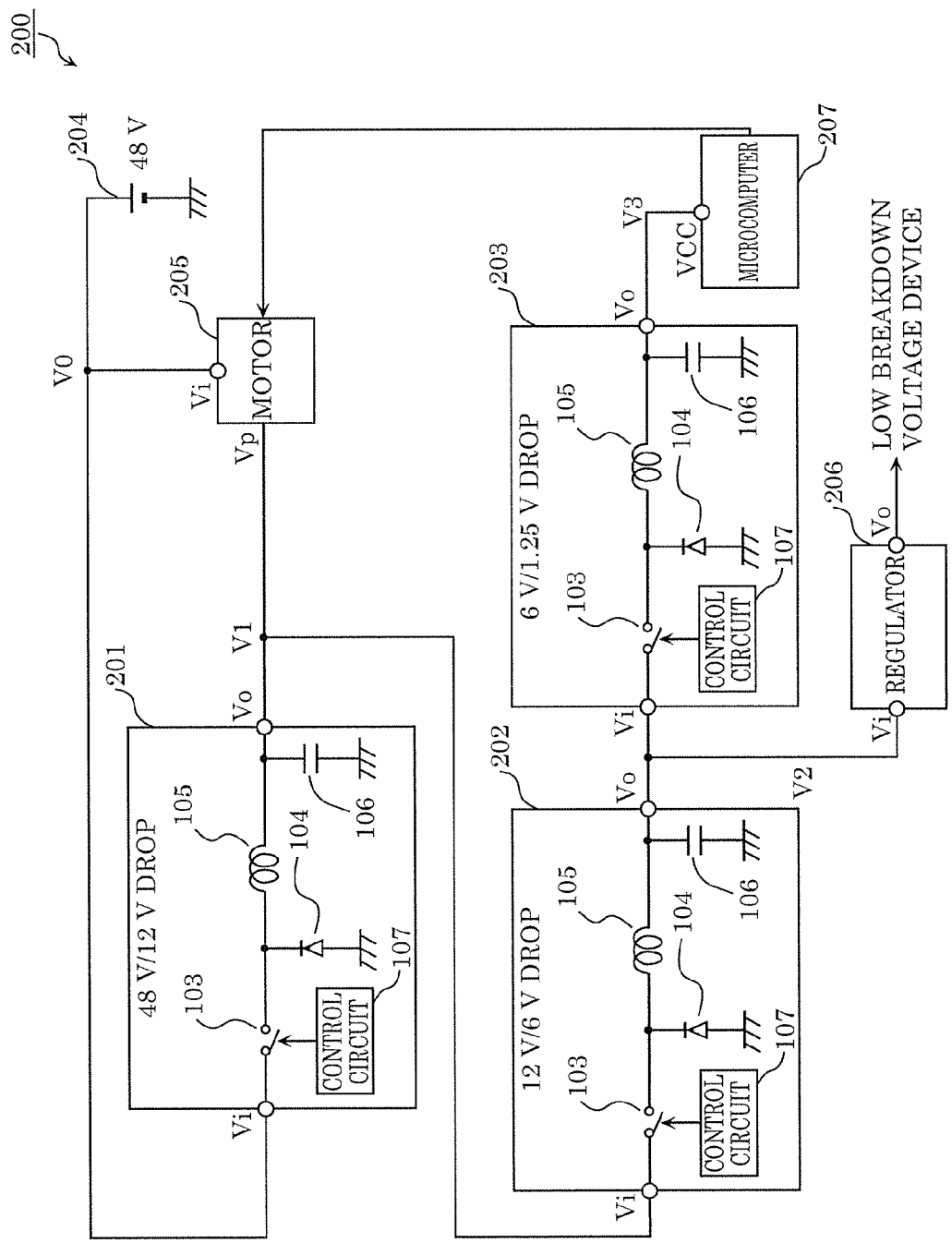
FIG. 5 is a configuration diagram of a motor control system according to Embodiment 1.

FIG. 5 is a diagram showing an example configuration of motor control system 200 according to the present embodiment. Motor control system 200 includes switching regulator 201 that steps down high voltage V0 of about 48V to medium voltage V1 of about 12V, switching regulator 202 that steps down voltage V1 to voltage V2 of about 6V, and switching regulator 203 that steps down voltage V2 to low voltage V3 of about 1.25V. Switching regulators 201 to 203 have a same configuration as switching regulator 100 in FIG. 1. Battery 204 supplies voltage V0 of about 48V to input terminal Vi of switching regulator 201 and power supply terminal Vi of motor 205. Output voltage V1 of switching regulator 201 is supplied to input terminal Vi of switching regulator 202 and pre-driver power supply terminal Vp of the motor. Output voltage V2 of switching regulator 202 is supplied to input terminal Vi of switching regulator 203 and input terminal Vi of regulator 206 that supplies power for a low breakdown voltage device. Output voltage V3 of switching regulator 203 is supplied to CPU power supply terminal VCC of motor control microcomputer 207.

In a case where battery 204 comes off due to vibration caused by driving of a vehicle, for example, a current flows back from motor 205, and a battery voltage transiently rises. At a time of start of an engine, an excessive drive current flows from battery 204 to motor 205, and the battery voltage is transiently reduced. Accordingly, switching regulator 201 has to perform stabilization control on output voltage V1 with respect to such transient fluctuations in the input voltage.

Regulator 206 is a power supply for a device which is sensitive to noise, such as a sensor, and thus, a low drop-out (LDO) regulator is used. With an LDO regulator, a power loss proportional to differential voltage (Vi–Vo) between input DC voltage Vi and output DC voltage Vo occurs, and thus, a measure is taken to bring input DC voltage Vi closer to output DC voltage Vo. Accordingly, a switching regulator with small fluctuations in output voltage, with respect to load fluctuations, is desired as switching regulator 202 as a power supply for regulator 206. A hysteresis control method which achieves high-speed responsiveness is particularly effective with respect to sudden load fluctuations.

Microcomputer 207 has to be able to perform sophisticated arithmetic computations at a high speed in order to achieve a high-level safety function and lower fuel consumption, and thus, a high-performance CPU is installed. Processes at a fine rule level, with low parasitic capacitance, are used for such a CPU so as to accelerate an operation clock. For example, such a CPU is a CPU that operates at a power supply voltage of around 1V, and an allowable power supply voltage fluctuation range is extremely small at about 2.5%. Furthermore, current consumption in an operation mode of the CPU is high, and thus, a current sharply fluctuates at a time of switching from a standby mode to the operation mode. Accordingly, switching regulator 203 which is capable of swiftly responding to sharp load fluctuations, and which achieves small output voltage fluctuations is desired.

As described above, by using switching regulator 100 according to the present embodiment, the following requirements may be satisfied: (1) to cope with a wide range of input voltage; and (2) to swiftly respond to load transient fluctuations (for example, about 2.5%). Moreover, fluctuations in the switching cycle may be suppressed, and occurrence of interference with radio frequency caused by fluctuations in a switching frequency (switching noise interference) may be suppressed.

Embodiment 2

In Embodiment 1, reference voltage Vr is changed only during an off period of drive signal Dr. In the present embodiment, a configuration for changing reference voltage Vr also in an on period, in addition to the off period of drive signal Dr, will be described. Additionally, in the following, differences from Embodiment 1 described above will be mainly described, and a redundant description will be omitted.

Figure 6:
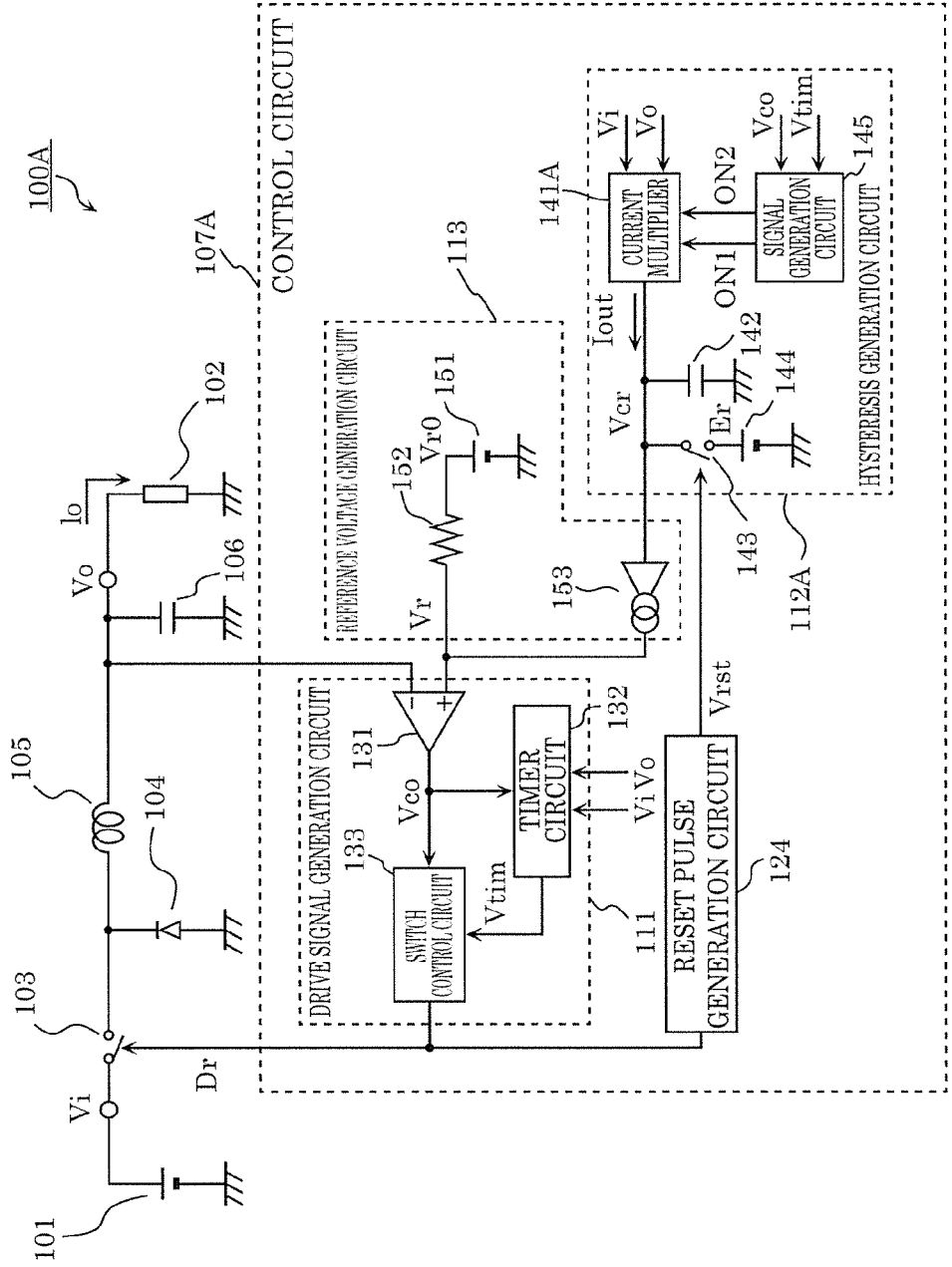
FIG. 6 is a configuration diagram of a switching regulator according to Embodiment 2.

FIG. 6 shows a configuration of switching regulator 100A according to the present embodiment. With switching regulator 100A shown in FIG. 6, a configuration of control circuit 107A is different from that of control circuit 107 in FIG. 1 in that control circuit 107A includes reset pulse generation circuit 124.

Furthermore, a configuration of hysteresis generation circuit 112A is different from that of hysteresis generation circuit 112 in that hysteresis generation circuit 112A includes voltage source 144 and signal generation circuit 145, and with respect to a function of current multiplier 141A. Voltage source 144 is connected in series with switch 143, and outputs voltage Er. Signal generation circuit 145 generates signal ON1, signal ON2 and the like to be input to current multiplier 141A.

Figure 7:
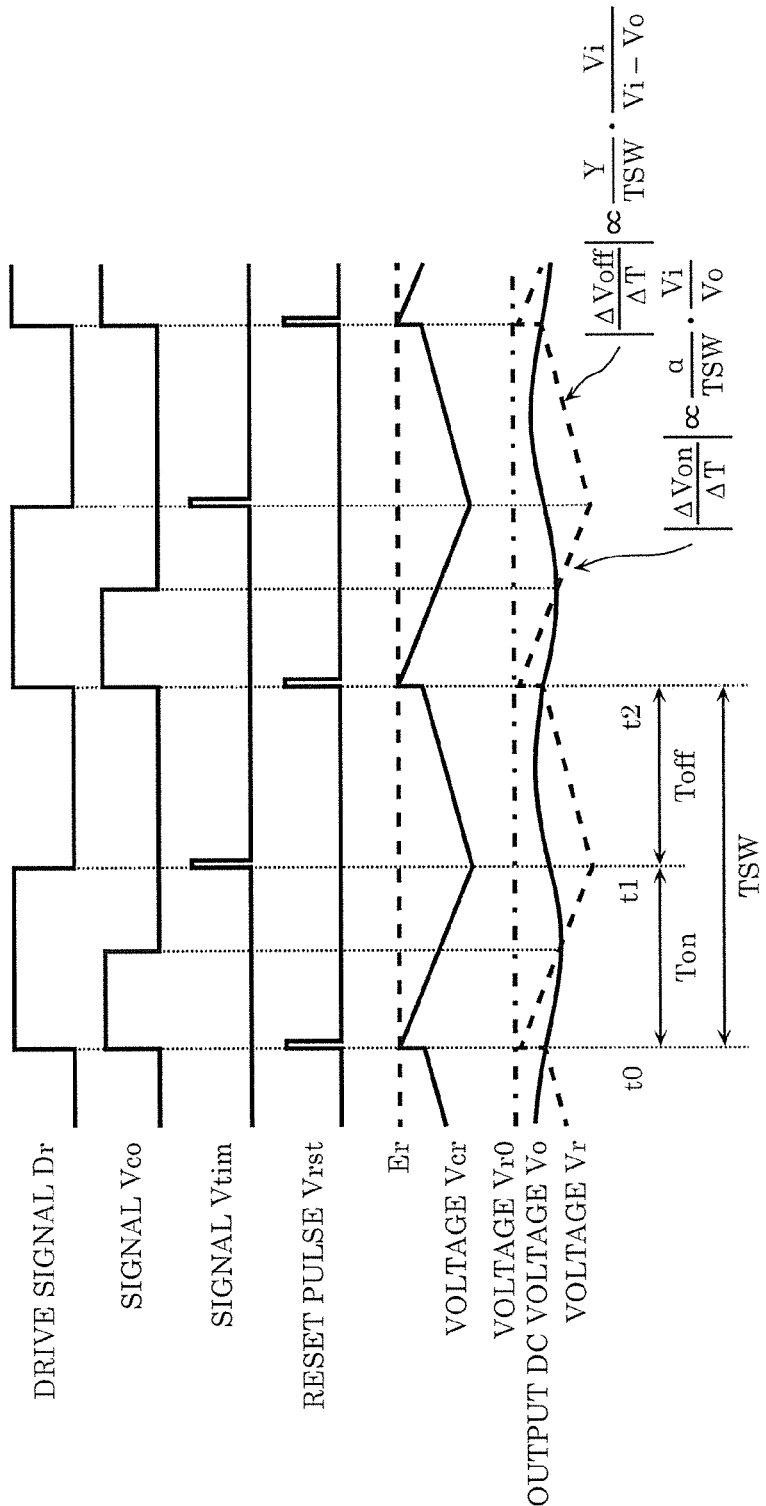
FIG. 7 is a timing chart showing an operation of the switching regulator according to Embodiment 2.

In the following, an operation of switching regulator 100A will be described. FIG. 7 is a timing chart showing an operation of switching regulator 100A.

First, when output DC voltage Vo falls to or below reference voltage Vr at time t0, output signal Vco from comparator 131 rises. Then, switch control circuit 133 raises drive signal Dr, and places switch device 103 in an on state.

Reset pulse generation circuit 124 generates reset pulse Vrst at a time of rising of drive signal Dr. Switch 143 is thereby temporarily turned on, and voltage Vcr of capacitor 142 is reset to voltage Er. Then, when switch 143 is turned off, voltage Vcr is reduced according to a current that is output from current multiplier 141A. Specifically, hysteresis generation circuit 112A controls gradient ΔVon/ΔT of voltage Vcr (i.e., gradient of reference voltage Vr) in an on period in a manner expressed by the following (Equation 6), with α as a proportionality constant. Additionally, the gradient indicated below is an absolute value of gradient.

$$\Delta Von/\Delta T = (\alpha/TSW) \cdot (Vi/Vo) \qquad \text{(Equation 6)}$$

That is, in the on period, output current Iout of current multiplier 141A is a sink current that is proportional to Vi/Vo, and voltage Vcr (reference voltage Vr) is reduced at a gradient proportional to Vi/Vo.

Amplitude ΔVr of reference voltage Vr is constant and is equal to a proportionality constant α, as given by the above-described (Equation 2) and (Equation 6) and the following (Equation 7).

$$\begin{aligned}\Delta Vr &= \Delta V/\Delta T \times Ton &\text{(Equation 7)}\\ &= (\alpha/TSW) \cdot (Vi/Vo) \times TSW \cdot Vo/Vi\\ &= \alpha\end{aligned}$$

As described above, with the switching regulator according to the present embodiment, amplitude ΔVr takes a constant value regardless of input DC voltage Vi and output DC voltage Vo. Accordingly, as in Embodiment 1, the control circuit may cope with wide fluctuations in input DC voltage Vi and output DC voltage Vo.

As in Embodiment 1, on time Ton is measured by timer circuit 132, and signal Vtim reaches a high level and drive signal Dr falls at time t1.

In the off period, the same operation as in Embodiment 1 is performed. That is, output current Iout of current multiplier 141A is proportional to Vi/(Vi−Vo), and voltage Vcr (reference voltage Vr) rises at gradient ΔV/ΔT proportional to Vi/(Vi−Vo) as expressed by (Equation 8), where γ is given as a proportionality constant.

$$\Delta V/\Delta T = (\gamma/TSW) \cdot Vi/(Vi-Vo) \qquad \text{(Equation 8)}$$

Amplitude ΔVr of reference voltage Vr in the off period is constant, and is equal to proportionality constant γ, as given by the above-described (Equation 3) and (Equation 8) and the following (Equation 9).

$$\Delta Vr = \Delta V/\Delta T \times Toff \qquad \text{(Equation 9)}$$
$$= (\gamma/TSW) \cdot Vi/(Vi-Vo) \times TSW \cdot (Vi-Vo)/Vi$$
$$= \gamma$$

Then, when output DC voltage Vo falls to or below reference voltage Vr at time t2, signal Vco rises, and an operation the same as at time t0 is performed. That is, from time t1 to time t2 is off time Toff of switch device 103. As described above, switch device 103 repeats a switching operation at switching cycle TSW, which is a sum of on time Ton and off time Toff.

Reference voltage Vr is equal to voltage Vr0 at time t0, but at time t2 after one cycle, the voltage is at a voltage expressed by (Equation 7), (Equation 9), and (Equation 10).

$$Vr = Vr0 - \alpha + \gamma \qquad \text{(Equation 10)}$$

Reference voltage Vr in (Equation 10) returns to voltage Vr0 by a reset pulse at a rise of signal Vco. If reference voltage Vr becomes higher than voltage Vr0 before reset, there is no offset voltage with respect to reference voltage Vr of comparator 131 before and after reset, and chattering occurs, thereby causing instability. Accordingly, constants α, γ are set to be α>γ.

Unlike in Embodiment 1, in the present embodiment, reference voltage Vr changes also in the on period, and thus, a pulse width of signal Vco which becomes high when reference voltage Vr is at or higher than output DC voltage Vo changes. The timing chart in FIG. 7 is a case where a high period of signal Vco is short, and output DC voltage Vo becomes higher than reference voltage Vr and signal Vco drops before on time Ton is measured by timer circuit 132. The timing chart in FIG. 8 is a case where the high period of signal Vco is long, and signal Vco drops after on time Ton is measured.

Figure 8:
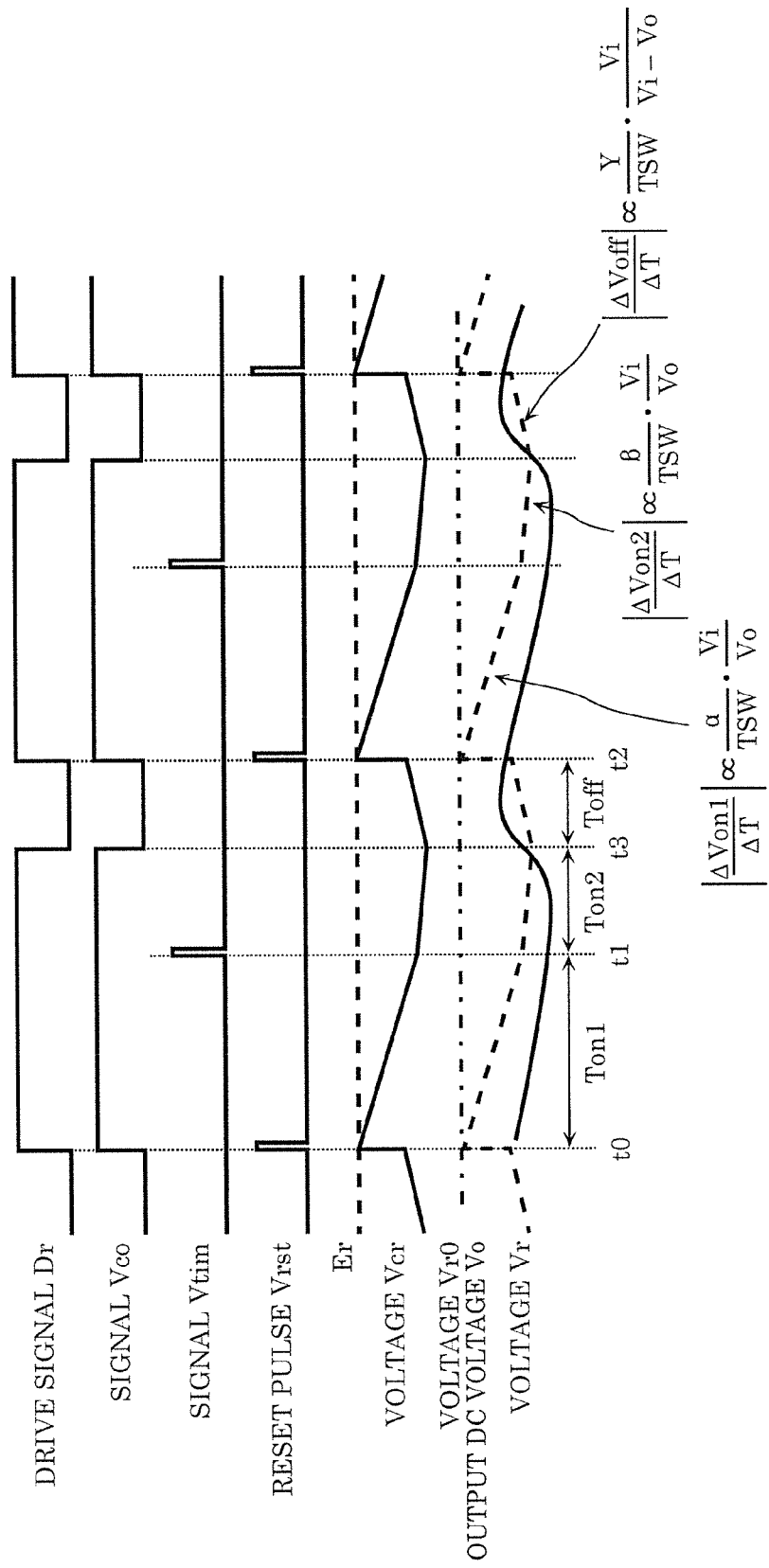
FIG. 8 is a timing chart showing an operation of the switching regulator according to Embodiment 2.

In FIG. 8, time t0 to t1 corresponding to Ton is referred to as a first on period, and the time is given as Ton1. Time t1 to t3 when signal Vco drops after a lapse of on time Ton1 is referred to as a second on period, and the time is given as Ton2.

Switch control circuit 133 generates drive signal Dr that turns on switch device 103 during a period from when reference voltage Vr reaches or exceeds output DC voltage Vo and output signal Vco rises, to a later one of (1) rising of signal Vtim after a lapse of on time Ton1, and (2) dropping of signal Vco after output DC voltage Vo becomes higher than reference voltage Vr.

As shown in FIG. 8, hysteresis generation circuit 112A controls gradient ΔVon2/ΔT of voltage Vcr (i.e., gradient of reference voltage Vr) in the second on period in a manner expressed by the following (Equation 11), with β as a proportionality constant.

$$\Delta Von2/\Delta T = (\beta/TSW) \cdot (Vi/Vo) \qquad \text{(Equation 11)}$$

Here, constant β is set smaller than constant α. That is, output current Iout of current multiplier 141A in the first on period is higher than output current Iout of current multiplier 141A in the second on period, and the gradient of reference voltage Vr in the first on period is greater than the gradient of reference voltage Vr in the second on period. The amplitude of reference voltage Vr may thereby be prevented from becoming great even when the on period is long.

Figure 9:
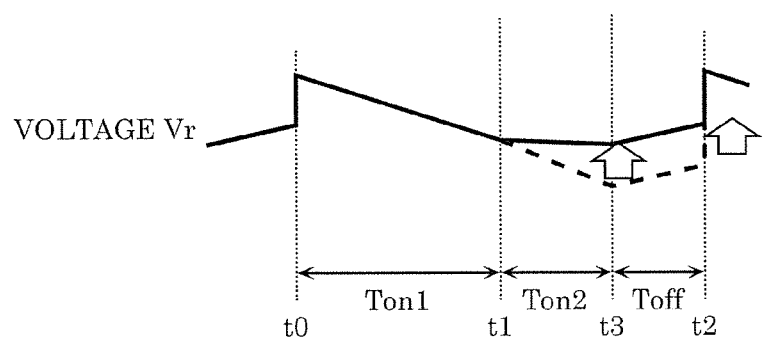
FIG. 9 is a diagram for describing an operation of the switching regulator according to Embodiment 2.

This effect will be described with reference to FIG. 9. In FIG. 9, a solid line indicates reference voltage Vr in a case where the gradient in the second on period is smaller than the gradient in the first on period, and a dotted line indicates reference voltage Vr in a case where the gradient in the second on period is the same as the gradient in the first on period. As shown in the drawing, in the case where the gradient in the second on period is the same as the gradient in the first on period, reference voltage Vr is more reduced as the on period becomes longer, and as a result, the amplitude of reference voltage Vr becomes great. On the other hand, as in the present embodiment, if the gradient in the second on period is made smaller than the gradient in the first on period, an increase in the amplitude may be suppressed.

Figure 10:
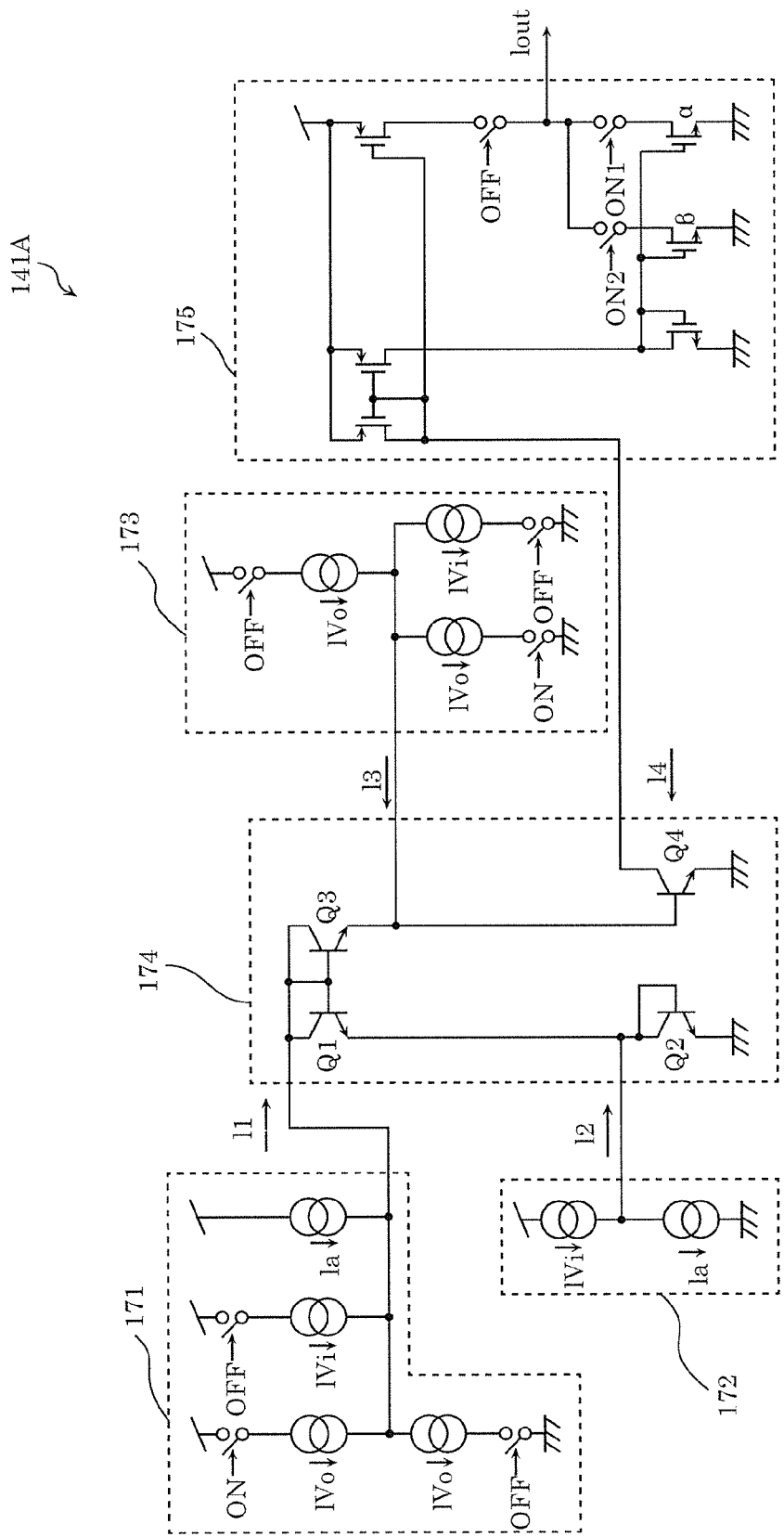
FIG. 10 is a configuration diagram of a current multiplier according to Embodiment 2.
Figure 11:
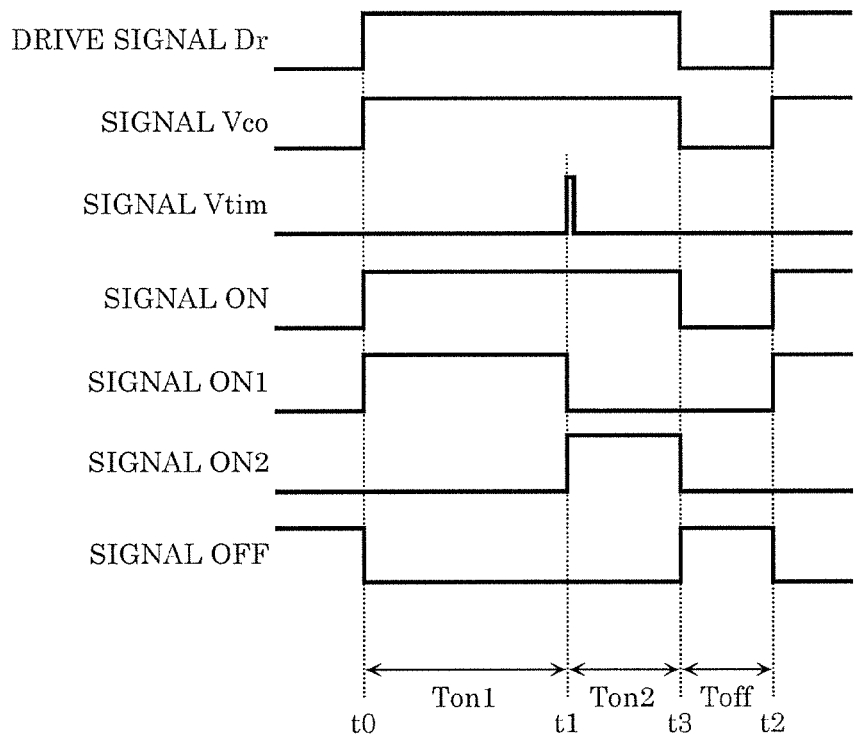
FIG. 11 is a timing chart showing control signals for the current multiplier according to Embodiment 2.

In the following, a specific circuit configuration of current multiplier 141A will be described. FIG. 10 is a circuit configuration diagram of current multiplier 141A, and FIG. 11 is a timing chart of control signals that are input to current multiplier 141A. Signal ON, signal ON1, signal ON2, and signal OFF shown in FIG. 11 are generated from signal Vco and signal Vtim by signal generation circuit 145.

Signal ON is a signal that reaches a high level in an on period (including the first on period and the second on period). Signal ON1 is a signal that reaches a high level in the first on period. Signal ON2 is a signal that reaches a high level in the second on period. Signal OFF is an inverted signal of signal ON, and is a signal that reaches a high level in the off period.

In FIG. 10, current multiplier 141A includes current source circuits 171, 172 and 173, multiplier 174, and output current mirror circuit 175. IVi is a current that is proportional to input DC voltage Vi, and Ivo is a current that is proportional to output DC voltage Vo. Furthermore, 2Ivo is a current that is twice Ivo, and Ia is a constant direct current.

Currents I1, I2 and I3 output from current source circuits 171, 172 and 173 are expressed by the following (Equation 12) in the on period, and by the following (Equation 13) in the off period.

$$I1 = Ivo + Ia, \; I2 = IVi - Ia, \; I3 = -Ivo \qquad \text{(Equation 12)}$$

$$I1 = IVi + Ia - IVo, \; I2 = IVi - Ia, \; I3 = IVo - IVi \qquad \text{(Equation 13)}$$

When an emitter current of NPN transistor QN (N=1, 2, 3, 4) in multiplier 174 is given as I(QN), relationships of the following (Equation 14) and (Equation 15) are established.

$$I(Q3) + I(Q1) = I1, \; I(Q2) = I(Q1) + I2 \qquad \text{(Equation 14)}$$

$$\therefore I(Q2) = -I(Q3) + I1 + I2 \qquad \text{(Equation 15)}$$

When a base-emitter voltage of QN is given as VBE(QN), a relationship of the following (Equation 16) is established.

$$VBE(Q1) + VBE(Q2) = VBE(Q3) + VBE(Q4) \qquad \text{(Equation 16)}$$

The emitter current of transistor QN is expressed by $I(QN)=Is \cdot \exp\{VBE(QN)/(kT)\}$, and thus, relationships of the following (Equation 17) and (Equation 18) are established.

$$I(Q1) \times I(Q2) = Is \cdot \exp\{VBE(Q1)/kT\} \times Is \cdot \exp\{VBE(Q2)/kT\} \quad \text{(Equation 17)}$$

$$I(Q3) \times I(Q4) = Is \cdot \exp\{VBE(Q3)/kT\} \times Is \cdot \exp\{VBE(Q4)/kT\} \quad \text{(Equation 18)}$$

The following (Equation 19) is obtained from (Equation 16) to (Equation 18).

$$I(Q4) = I(Q1) \times I(Q2)/I(Q3) \quad \text{(Equation 19)}$$

By substituting (Equation 14) and (Equation 15) in (Equation 19), (Equation 20) is obtained.

$$I(Q4) = (-I(Q3)+I1) \cdot (-I(Q3)+I1+I2)/I(Q3) \quad \text{(Equation 20)}$$

$I(Q4)$, $I(Q3)$ are approximated in a manner expressed by the following (Equation 21) by using hFE>>1 of NPN.

$$I(Q4)=I4, \; I(Q3)=-I3 \quad \text{(Equation 21)}$$

By substituting (Equation 21) in (Equation 20), (Equation 22) is obtained.

$$I4=-(I3+I1) \cdot (I3+I1+I2)/I3 \quad \text{(Equation 22)}$$

Accordingly, current I4 in the on period is expressed by (Equation 23).

$$I4=-(-Ivo+Ivo+Ia) \cdot (-Ivo+Ivo+Ia+Ivi-Ia)/(-Ivo)=Ia \cdot (Ivi/Ivo) \quad \text{(Equation 23)}$$

That is, the following (Equation 24) is established for output current Iout of current multiplier 141A.

$$Iout \propto Vi/Vo \propto (1/Ton) \quad \text{(Equation 24)}$$

That is, output current Iout of current multiplier 141A in the on period is proportional to Vi/Vo.

Current I4 in the off period is expressed by the following (Equation 25).

$$I4=-(Ia) \cdot (Ivi)/(Ivo-Ivi)=Ia/(1-Ivo/Ivi) \quad \text{(Equation 25)}$$

That is, the following (Equation 26) is established with respect to output current Iout of current multiplier 141A.

$$Iout \propto 1(1-Vo/Vi) \propto (1/Toff) \quad \text{(Equation 26)}$$

That is, output current Iout of current multiplier 141A in the off period is proportional to (1−Vo/Vi).

A mirror ratio of output current mirror circuit 175 is set to (α>β). Accordingly, output current Iout in the second on period is lower than output current Iout in the first on period.

By causing signal ON1 and signal ON2 to be off (low level) at all times in the configuration shown in FIG. 10, functions of current multiplier 141 of Embodiment 1 may be realized.

Embodiment 3

Figure 12:
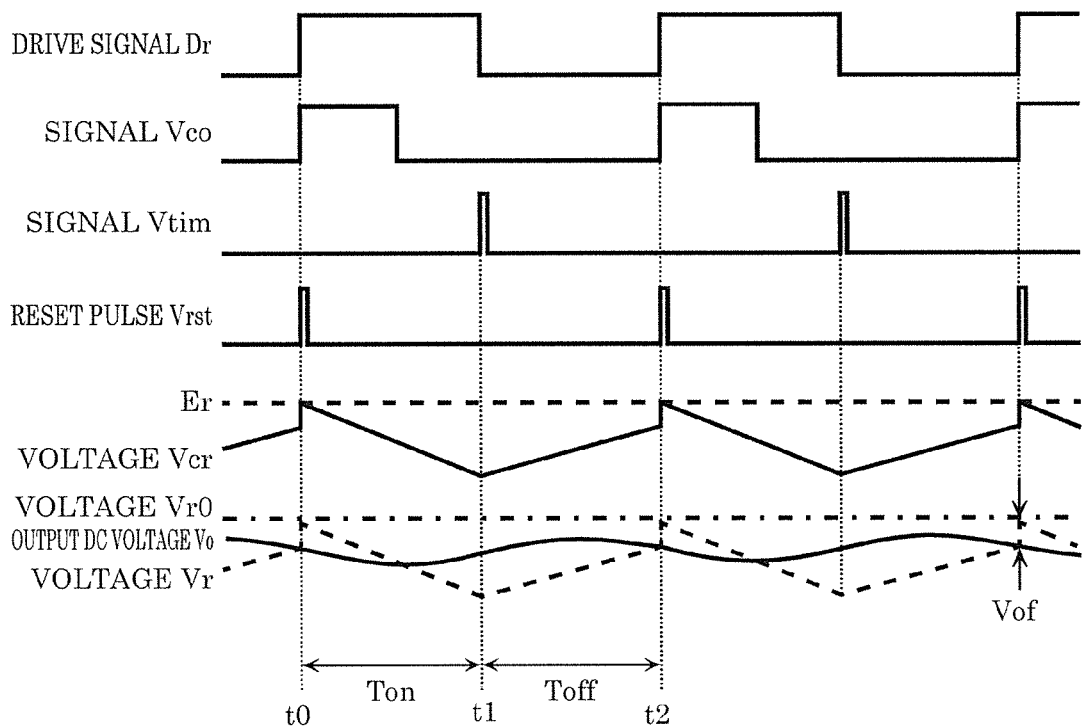
FIG. 12 is a timing chart showing an operation of the switching regulator according to Embodiment 2.

FIG. 12 is a diagram which is the timing chart in FIG. 7 according to Embodiment 2, to which offset voltage Vof is added. In a case where output DC voltage Vo becomes higher than reference voltage Vr and voltage Vco drops before a lapse of on time Ton measured by timer circuit 132, reference voltage Vr inevitably becomes lower than reset voltage Vr0, and offset voltage Vof=(Vr0−Vr) is caused. An influence of offset voltage Vof on ratio Vo/Vi between input DC voltage Vi and output DC voltage Vo will be described with respect to a case where Vo/Vi is high, for example.

Figure 13:
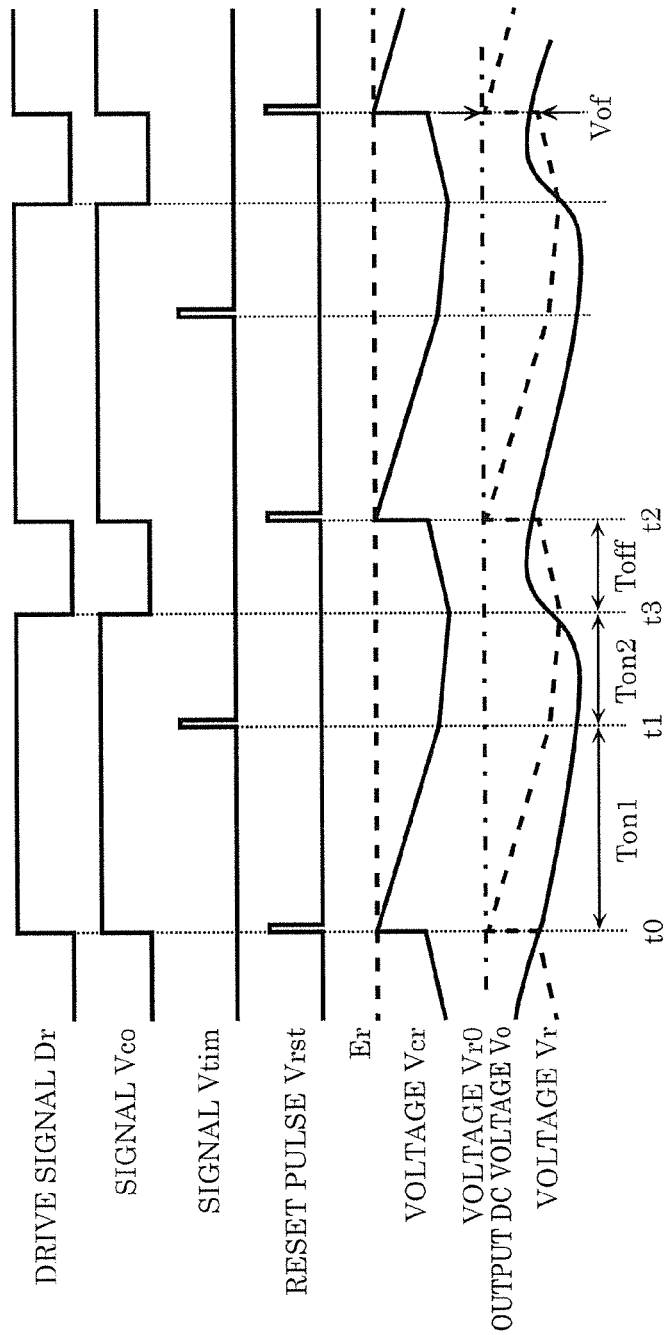
FIG. 13 is a timing chart showing an operation of the switching regulator according to Embodiment 2.

FIG. 13 is a diagram which is the timing chart in FIG. 8 according to Embodiment 2, to which offset voltage Vof is added, and shows a case where signal Vco drops after a lapse of on time Ton. The amplitude of voltage Vr increases also during second on period Ton2 after a lapse of on time Ton, and thus, offset voltage Vof is increased and output DC voltage Vo is reduced compared to a case where Vo/Vi is small.

A configuration of suppressing fluctuations that are based on input/output DC voltage ratio Vo/Vi by providing a correction circuit will be described.

Figure 14:
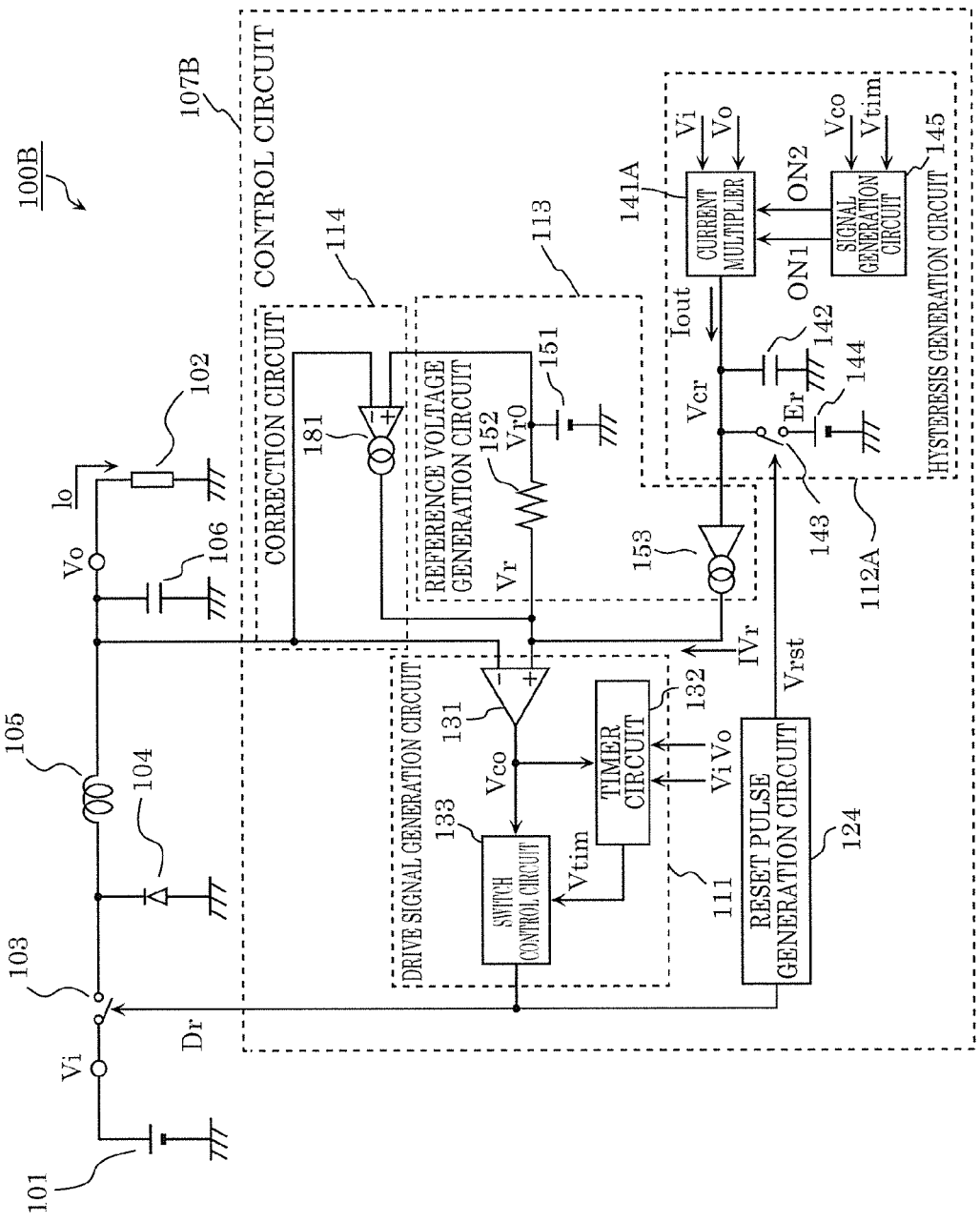
FIG. 14 is a configuration diagram of a switching regulator according to Embodiment 3.

FIG. 14 is a diagram showing a configuration of switching regulator 100B according to Embodiment 3. With switching regulator 100B shown in FIG. 14, a configuration of control circuit 107B is different from that of control circuit 107A shown in FIG. 6, and correction circuit 114 that corrects output DC voltage Vo is provided.

Correction circuit 114 is configured by amplifier 181, which is a differential voltage input current amplifying/output device.

Amplifier 181 compares output DC voltage Vo with voltage Vr0 of reference voltage source 151, and amplifies and generates an output current that is according to voltage difference (Vr0−Vo). An output of amplifier 181 is connected to resistor 152 and a positive input terminal of comparator 131, and an output current of amplifier 181 flows through resistor 152.

Figure 15:
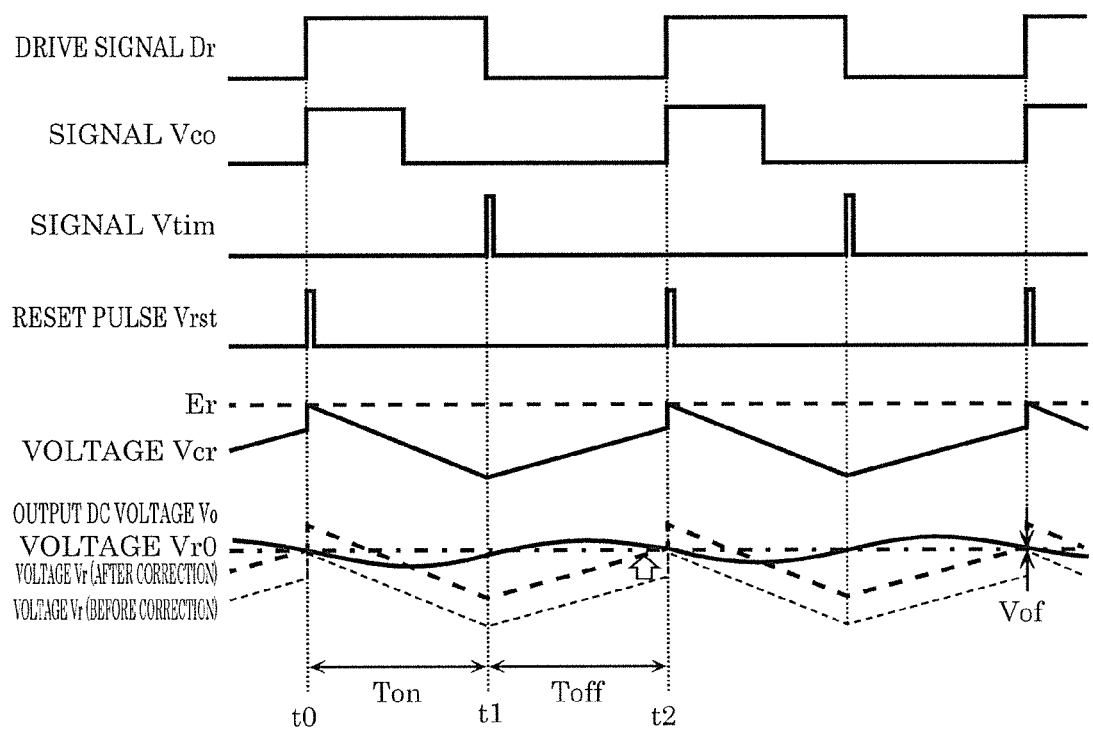
FIG. 15 is a timing chart showing an operation of the switching regulator according to Embodiment 3.

FIG. 15 is a timing chart for switching regulator 100B according to the present embodiment. As in FIG. 13, a case is shown where output DC voltage Vo becomes higher than reference voltage Vr and Vco is dropped before a lapse of on time Ton measured by timer circuit 132. Offset voltage Vof=Vr0−Vr is caused, but correction circuit 114 raises voltage Vr to cause an output current according to offset voltage Vof to flow through resistor 152, and eventually, voltages become balanced when reference voltage Vr and voltage Vr0 become equal to each other, and offset voltage Vof is cancelled.

Figure 16:
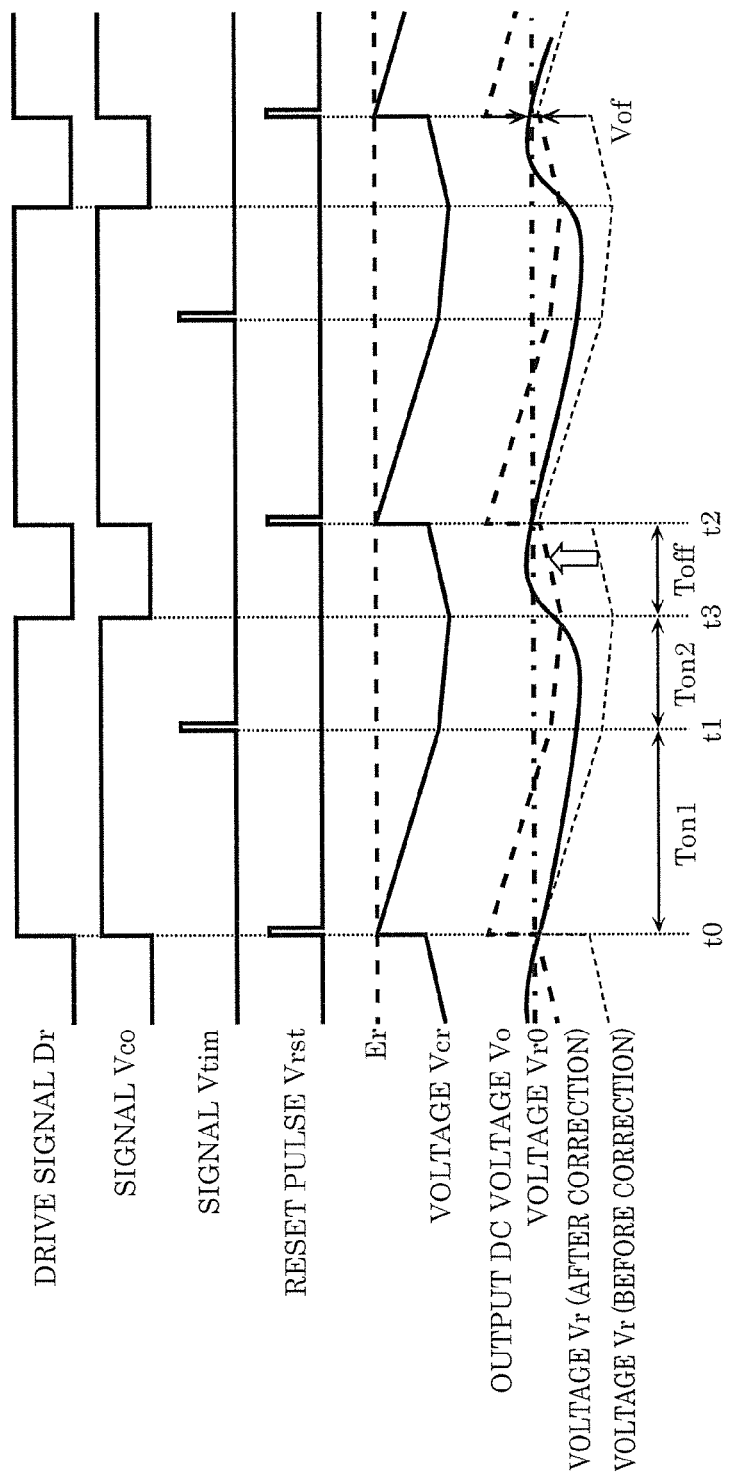
FIG. 16 is a timing chart showing an operation of the switching regulator according to Embodiment 3.

Like FIG. 13, FIG. 16 is a diagram showing a case where signal Vco drops after a lapse of on time Ton. Also in this case, correction circuit 114 compares output DC voltage Vo with voltage Vr0, which is an output voltage of reference voltage source 151, and causes an output current to flow through resistor 152. An operating point of reference voltage Vr is thereby corrected to cause the voltages to be approximately equal to each other, and offset voltage Vof is cancelled. As a result, fluctuations in the offset voltage caused by input/output voltage ratio Vo/Vi are eliminated.

Figure 17:
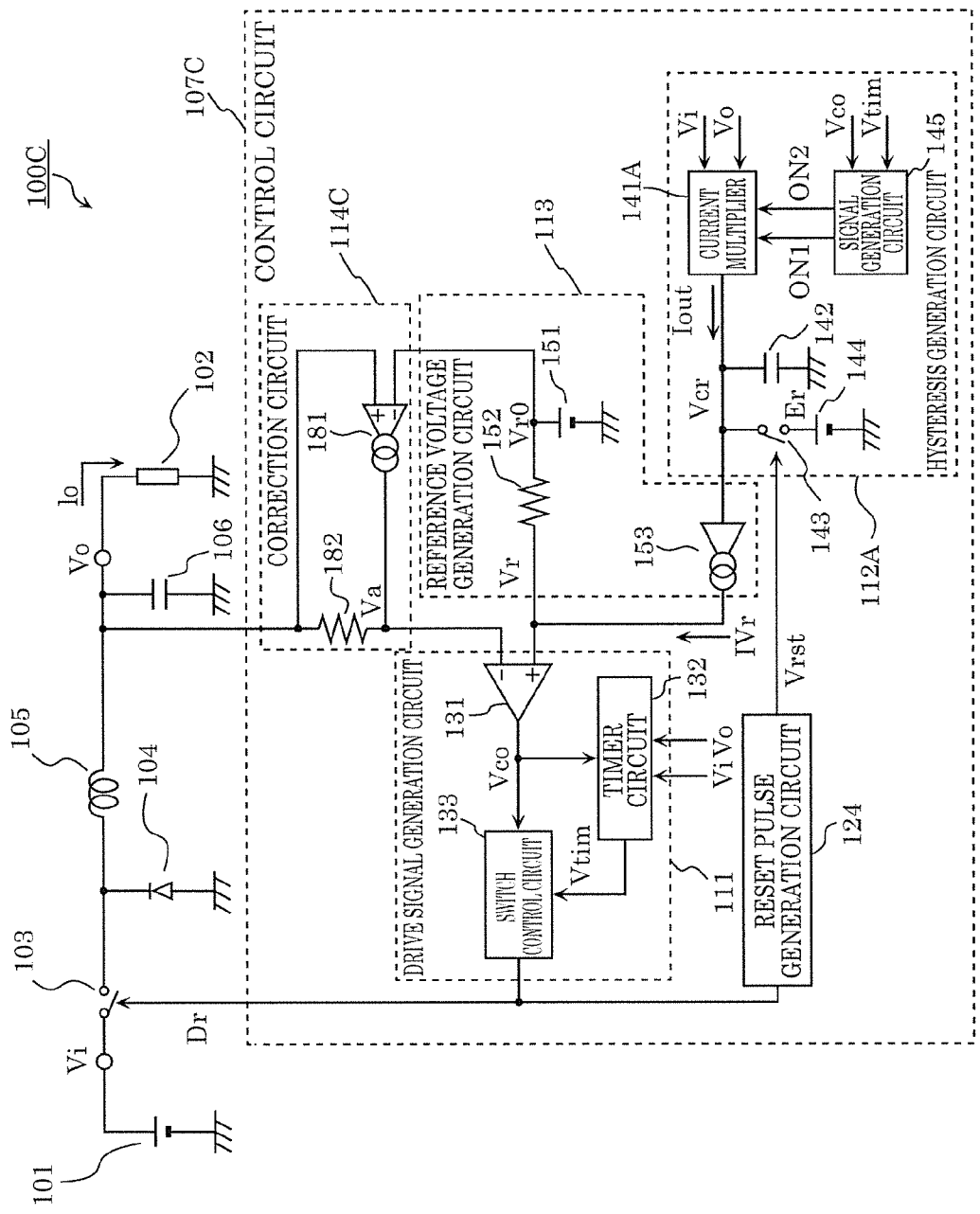
FIG. 17 is a configuration diagram of a switching regulator according to a variation of Embodiment 3.

FIG. 17 is a configuration diagram of switching regulator 100C according to a variation of the present embodiment. Switching regulator 100C shown in FIG. 17 is different from switching regulator 100B shown in FIG. 14, with a configuration of correction circuit 114C included in control circuit 107C being different from the configuration of correction circuit 114 included in control circuit 107B.

Correction circuit 114C includes amplifier 181 and resistor 182. Resistor 182 is connected between output terminal Vo of switching regulator 100C and a negative input terminal of comparator 131 of the drive signal generation circuit. With respect to amplifier 181, output DC voltage Vo is applied to a positive input terminal, a negative input terminal is connected to reference voltage source 151, and an output terminal is connected to a connection point of resistor 182 and the negative input terminal of comparator 131.

Figure 18:
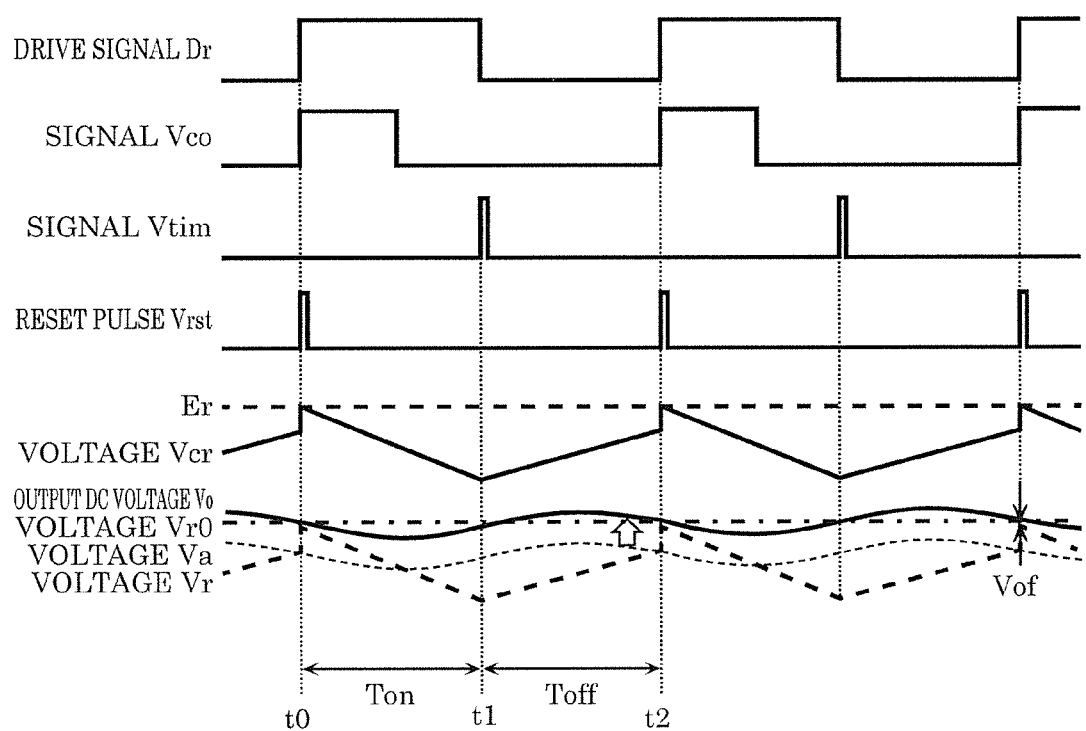
FIG. 18 is a timing chart showing an operation of the switching regulator according to the variation of Embodiment 3.

FIG. 18 is a timing chart for switching regulator 100C shown in FIG. 17. If output voltage correction is not performed, reference voltage Vr and output DC voltage Vo become equal to each other at time t2, and an output signal of comparator 131 is inverted. At this time, because reference voltage (in the drawing, voltage of resistor 152) Vr is reset to voltage Vr0 of reference voltage source 151. Because voltage Vr is set to be inevitably lower than voltage Vr0, offset voltage Vof is caused for output DC voltage Vo with respect to Vr0.

However, with switching regulator 100C according to the present variation, a voltage at the positive input terminal of amplifier 181 of correction circuit 114C is reduced by offset voltage Vof, and amplifier 181 of correction circuit 114C outputs a current in a negative direction. Voltage Va at the negative input terminal of comparator 131 is reduced, by the negative current, from output DC voltage Vo by the amount of voltage drop at resistor 182. Output DC voltage Vo is thus controlled in a direction of rising.

With correction circuit 114C, output DC voltage Vo and voltage Vr0 become balanced when the voltages become equal to each other, and offset voltage Vof is cancelled.

As described above, according to the present embodiment, an operating point of voltage Vr is corrected by correction circuit 114 or 114C to thereby reduce fluctuations in the output voltage caused by fluctuations in the input voltage.

Embodiment 4

Figure 19:
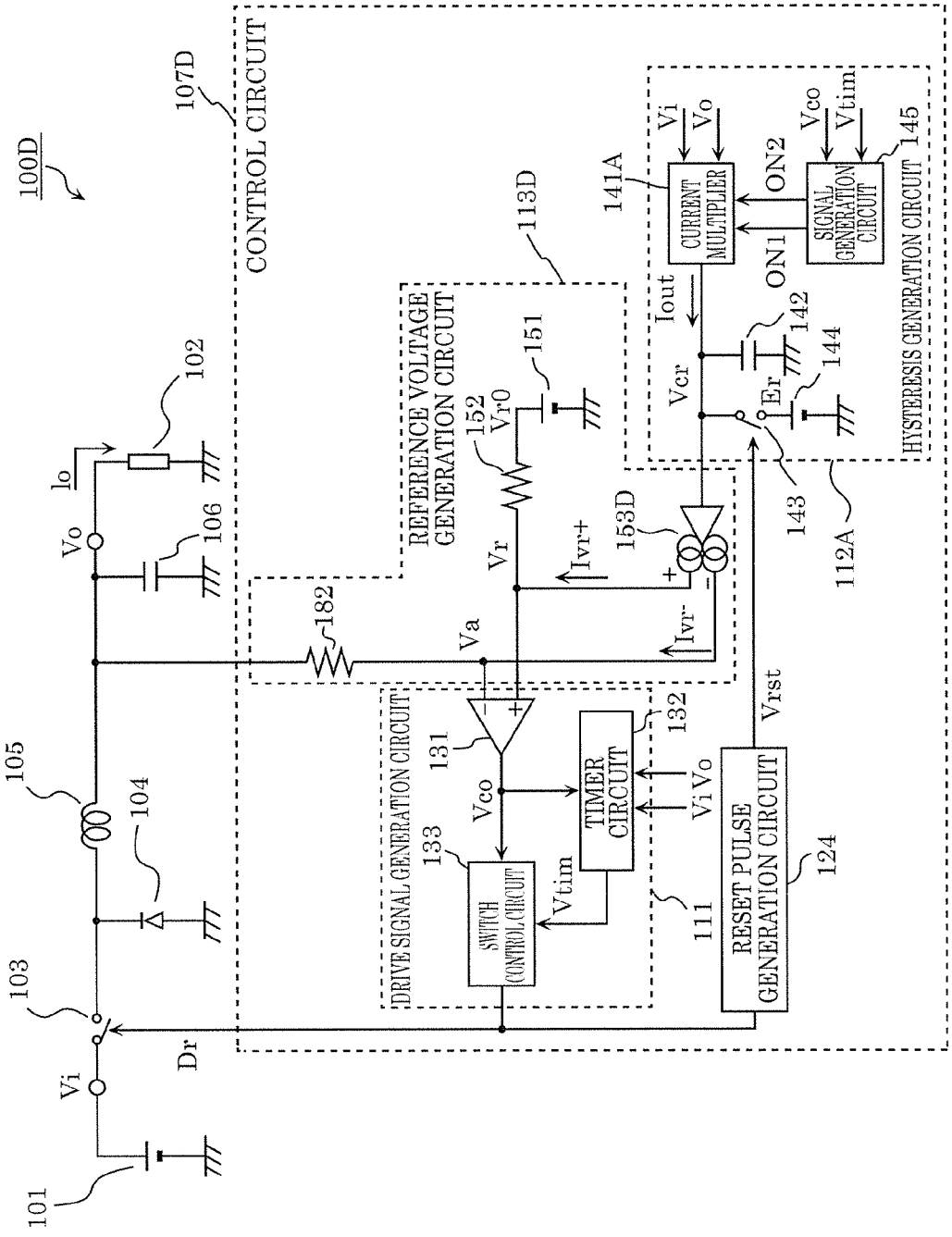
FIG. 19 is a configuration diagram of a switching regulator according to Embodiment 4.

In a present embodiment, a configuration where a differential output type converter is used as voltage current converter 153 will be described. FIG. 19 is a configuration diagram of switching regulator 100D according to Embodiment 4. With switching regulator 100D shown in FIG. 19, a configuration of reference voltage generation circuit 113D included in control circuit 107D is different from that of reference voltage generation circuit 113 included in control circuit 107A shown in FIG. 6, and also, voltage current converter 153D of a differential current output type and resistor 182 are provided.

Resistor 182 shown in FIG. 19 is connected between an output terminal where output DC voltage Vo is output, and a negative input terminal of comparator 131. Output voltage Vcr of current multiplier 141A is applied to an input terminal of voltage current converter 153D. Voltage current converter 153D outputs a current that is proportional to γ·Vcr to a positive output terminal, and outputs a current that is proportional to −γ·Vcr to a negative output terminal. Here, γ is a proportionality constant that satisfies 0<γ<1, and a description is given assuming γ=½ is true. Positive output current Ivr+ of voltage current converter 153D is supplied to a connection point of a positive input terminal of comparator 131 and resistor 152, and negative output current Ivr− is supplied to a connection point of the negative input terminal of comparator 131 and resistor 182.

Figure 20:
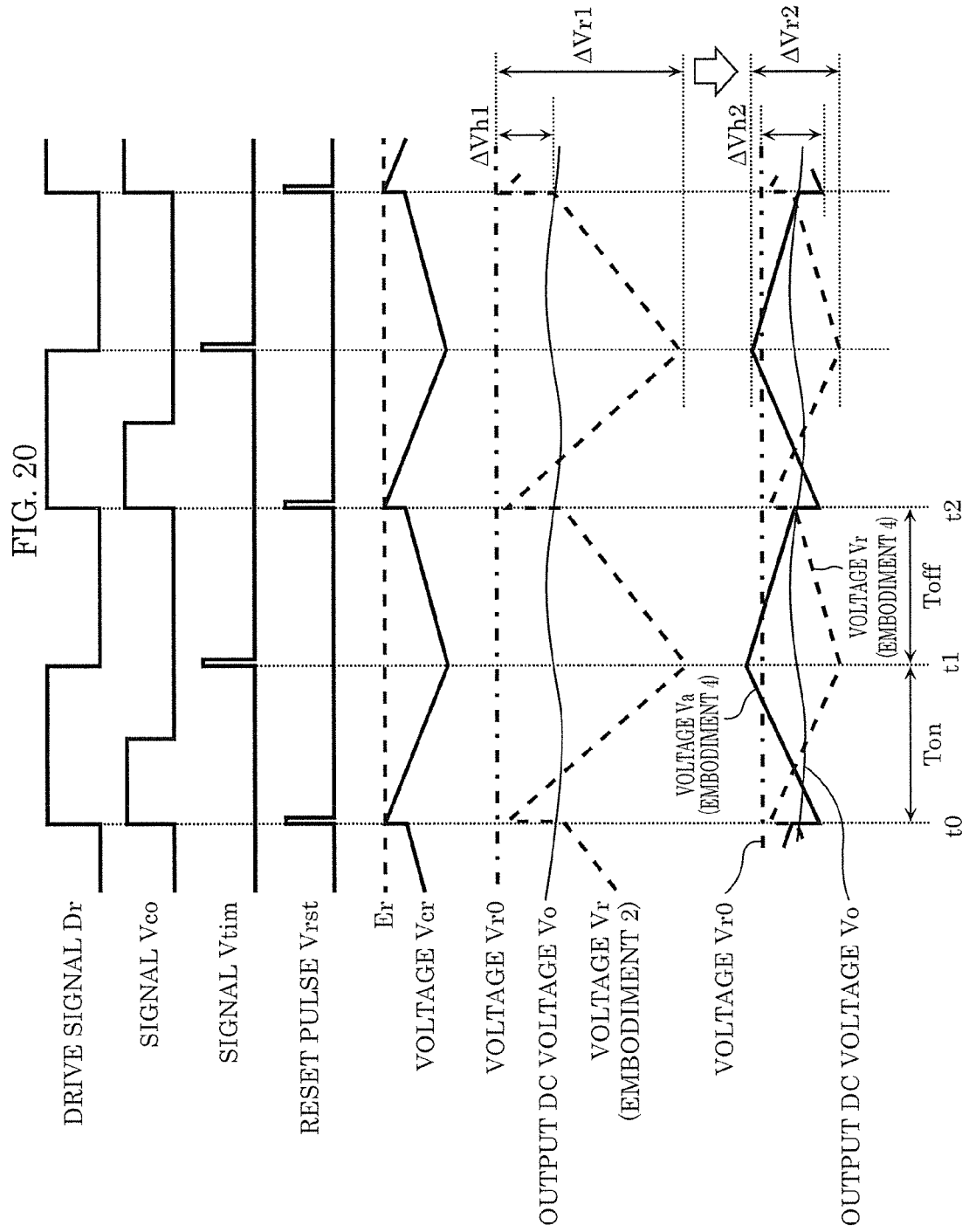
FIG. 20 is a timing chart showing an operation of the switching regulator according to Embodiment 4.

FIG. 20 is a timing chart for switching regulator 100D according to the present embodiment. At time t0, positive input voltage Vr of comparator 131 is reset to voltage Vr0, and negative input voltage Va is reset to output DC voltage Vo. At time t1 after a lapse of Ton period, positive input voltage Vr and negative input voltage Va of comparator 131 are Vr=Vr0+(½)·Vcr·Ton and Va=Vo−(½)·Vcr·Ton, respectively, and thus, differential voltage ΔVr2 between positive input voltage Vr and negative input voltage Va is expressed by the following (Equation 27).

$$\Delta Vr2 = Va - Vr = -(Vr0 - Vo) + Vcr \cdot Ton \quad \text{(Equation 27)}$$

Amplitude ΔVr1 of positive input voltage Vr of comparator 131 at time t1 in Embodiment 2 is ΔVr1=Vcr·Ton, and thus, amplitude ΔVr2 of the input voltage in Embodiment 4 expressed by (Equation 27) is smaller.

In Embodiment 2, an input differential voltage amplitude of comparator 131 may be reduced to half by reducing an output current of voltage current converter 153 to half, but in this case, differential voltage ΔVh1 between reference voltage Vr of comparator 131 at the time of detection and reference voltage Vr after reset is also reduced to half.

When differential voltage ΔVh1 is reduced, a disturbance noise exceeding differential voltage ΔVh1 is highly likely to occur, and chattering is caused in comparator 131 and a switching operation becomes unstable.

On the other hand, in Embodiment 4, a differential voltage between the time of detection and after reset of positive input voltage Vr is reduced to half, and a differential voltage between the time of detection and after reset of negative input voltage Va is reduced to half, but comparator 131 detects a positive/negative input voltage difference, and thus voltage difference ΔVh2 between the time of detection and after reset is the same as in Embodiment 2.

In the present embodiment, a voltage amplitude of reference voltage Vr is reduced such that stable operation may be performed even if an input dynamic range of comparator 131 is reduced. Accordingly, the configuration of the present embodiment is advantageous especially in the case of low-voltage operation.

Typically, switching regulators 100, 100A, 100B, 100C, and 100D according to the embodiments described above are wholly or partly implemented as an LSI, which is an integrated circuit. These may be separate individual chips, or may be partly or wholly contained on one chip.

Figure 21:
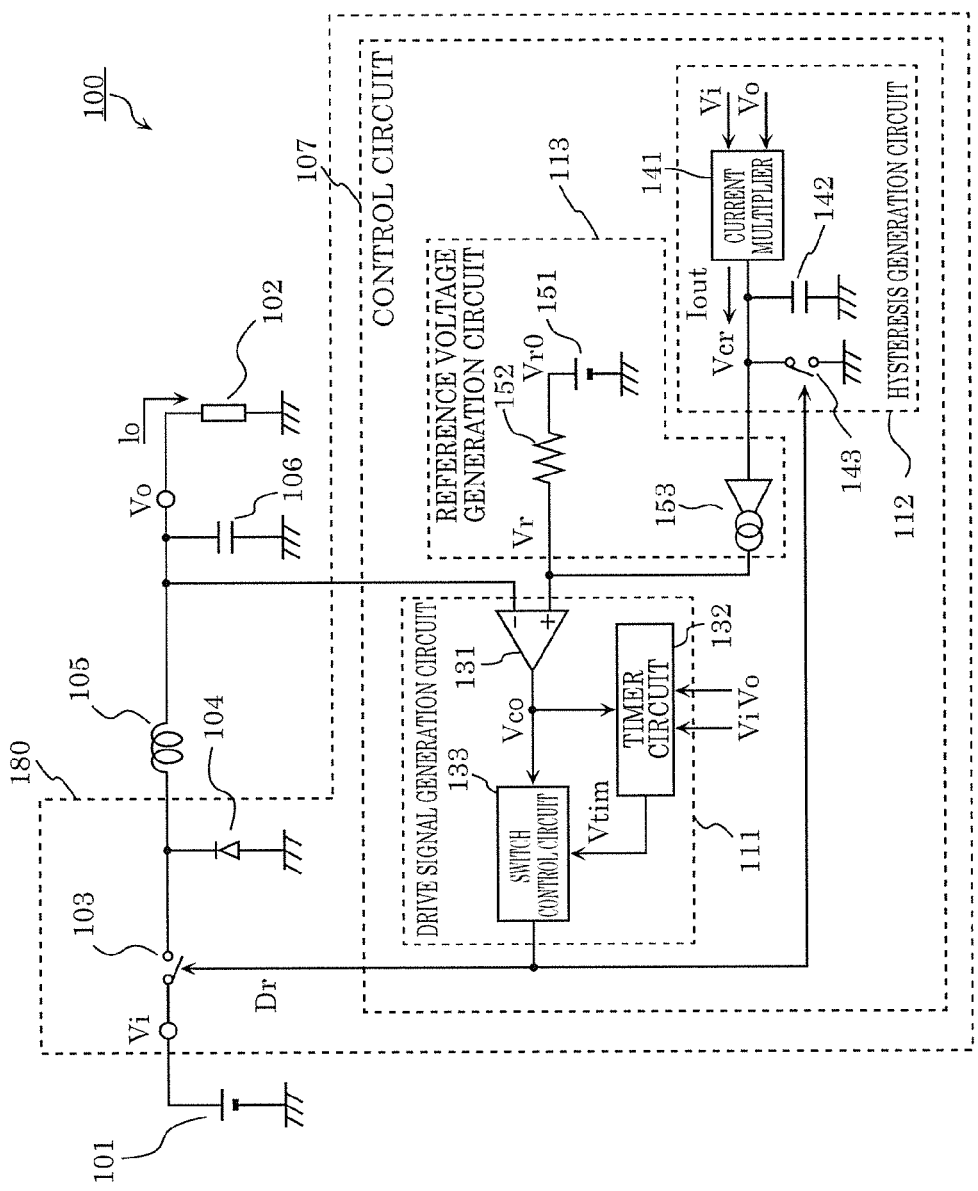
FIG. 21 is a diagram showing an example of an integrated circuit of the switching regulator according to Embodiment 1.

For example, as in the case of semiconductor integrated circuit 180 shown in FIG. 21, switch device 103, diode 104, and control circuit 107 may be contained on one chip. One chip is advantageous in that the system may be miniaturized due to reduction in the number of components. However, there is a demerit that heat is concentrated, because switch device 103 and diode 104 are heat sources. Accordingly, it is important to optimize the configuration according to use. Additionally, FIG. 21 shows an example of switching regulator 100 according to Embodiment 1, but the same thing applies also to switching regulator 100A according to Embodiment 2, switching regulators 100B, 100C according to Embodiment 3, and switching regulator 100D according to Embodiment 4.

Furthermore, the means for circuit integration is not limited to an LSI, and implementation by a dedicated circuit or a general-purpose processor is also possible. A field programmable gate array (FPGA), which is programmable after the LSI is manufactured, or a reconfigurable processor in which connections and settings of circuit cells within the LSI are reconfigurable may also be used.

Heretofore, switching regulators according to the present embodiments have been described, but the present disclosure is not limited to the embodiments.

For example, the circuit configurations shown in the circuit diagrams described above are merely examples, and the present disclosure is not limited to the circuit configurations described above. That is, a circuit which is capable of realizing characteristic functions of the present disclosure, in the same manner as with the circuit configurations described above, is also included in the present disclosure. For example, the present disclosure includes an element to which an element such as a switching element (transistor), a resistive element, or a capacitance element is connected in series or in parallel, so long as the same functions as those of the circuit configurations described above can be realized. In other words, "connected" in the embodiments described above is not limited to a case where two terminals (nodes)

are directly connected, but also includes a case where the two terminals (nodes) are connected via an element, so long as the same functions can be realized.

A logic level represented by high/low or a switching state represented by on/off is presented as an example to specifically describe the present disclosure, and an equivalent effect may be obtained by different combinations of exemplified logic levels or switching states. The configurations of the above-described logic circuit are presented as examples to specifically describe the present disclosure, and an equivalent input/output relationship may be realized by a logic circuit having a different configuration. An n-type, a p-type, and the like of the transistor and the like are used as examples to specifically describe the present disclosure, and the present disclosure is not limited thereto.

Moreover, division of functional blocks (circuit blocks) in the block diagrams and the like are merely examples, and a plurality of functional blocks may be implemented in one functional block, or one functional block may be divided into a plurality of blocks, or a part of the functions may be moved to a different functional block.

Moreover, the type of transistor described above (MOS transistor or bipolar transistor) is merely an example, and a different type of transistor may also be used.

The switching regulator according to one or more aspects have been described above based on the embodiments, but the present disclosure is not limited to the embodiments. Various modifications which are conceived by those skilled in the art to be applied to the present embodiments, and modes obtained by combining structural elements of different embodiments may also be included within the scope of one or more aspects without departing from the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure may be applied to a switching regulator, and is especially useful for a switching regulator of a vehicle-mounted microcomputer power supply.

What is claimed is:

1. A switching regulator, comprising:
   a switch device that is connected between an input terminal to which an input DC voltage is applied and an output terminal from which an output DC voltage is output, and that is turned on and off according to a drive signal;
   a hysteresis generation circuit to which the input DC voltage and the output DC voltage are applied;
   a reference voltage generation circuit that generates a reference voltage having a gradient proportional to one of an output current and an output voltage; and
   a drive signal generation circuit that generates the drive signal by comparing the output DC voltage with the reference voltage, wherein
   the hysteresis generation circuit generates the one of the output current and the output voltage that is inversely proportional to a differential voltage between the input DC voltage and the output DC voltage.

2. The switching regulator according to claim 1, wherein the hysteresis generation circuit generates the one of the output current and the output voltage that is proportional to the input DC voltage.

3. The switching regulator according to claim 1, wherein the drive signal generation circuit includes:
   a comparator that includes a first input terminal and a second input terminal, and that compares the output DC voltage that is applied to the second input terminal with the reference voltage that is applied to the first input terminal;
   a timer circuit that measures a time length that is proportional to the output DC voltage and inversely proportional to the input DC voltage, from when an output signal of the comparator is inverted; and
   a switch control circuit that generates the drive signal that turns on the switch device in a period from when the output signal of the comparator is inverted to when the time length elapses.

4. The switching regulator according to claim 1, wherein the hysteresis generation circuit includes a current multiplier that generates the output current.

5. The switching regulator according to claim 1, wherein the hysteresis generation circuit further includes:
   a capacitor that is charged with the output current; and
   a switch that discharges a voltage of the capacitor according to the drive signal.

6. The switching regulator according to claim 5, wherein the reference voltage generation circuit includes:
   a reference voltage source;
   a first resistor that is connected to the reference voltage source; and
   a voltage current converter that converts the voltage of the capacitor into a current and supplies the current to the first resistor.

7. The switching regulator according to claim 4, wherein the output current generated by the output current is proportional to the input DC voltage and inversely proportional to the output DC voltage in an on period of the switch device, the on period being a period during which the switch device is on.

8. The switching regulator according to claim 7, wherein the switch control circuit generates the drive signal that turns on the switch device during a period from when an output signal of the comparator is inverted, to a later one of (1) when a time length elapses at the timer circuit, and (2) when the output signal of the comparator is inverted again, and
with the hysteresis generation circuit, the output current of the current multiplier in a first on period from when the output signal is inverted to when the time length elapses is higher than the output current of the current multiplier in a second on period from when the time length elapses to when the output signal of the comparator is inverted again.

9. The switching regulator according to claim 6, wherein the switching regulator includes
   an amplifier that amplifies and converts a differential voltage between a voltage of the reference voltage source and the output DC voltage into a current, wherein an output current of the amplifier is supplied to the first resistor of the reference voltage generation circuit.

10. The switching regulator according to claim 7, wherein the switching regulator includes:
- an amplifier that amplifies and converts a differential voltage between a voltage of the reference voltage source and the output DC voltage into a current; and
- a second resistor that is connected between the output terminal of the switching regulator and a second input terminal of the comparator of the drive signal generation circuit, and the switching regulator is configured:
- to supply an output current of the voltage current converter to the first resistor; and
- to supply an output current of the amplifier to the second resistor.

11. The switching regulator according to claim 5, wherein the reference voltage generation circuit includes a second resistor that is connected between the output terminal of the switching regulator and a second input terminal of the comparator of the drive signal generation circuit, the voltage current converter includes a first current output terminal and a second current output terminal that output currents of different polarities, and the switching regulator is configured:
- to supply a current from the first current output terminal of the voltage current converter to the first resistor; and
- to supply a current from the second current output terminal of the voltage current converter to the second resistor.

12. The switching regulator according to claim 1, wherein the switching regulator is partly or wholly implemented as an integrated circuit.

13. The switching regulator according to claim 1, wherein the switching regulator is for being mounted on a vehicle.

* * * * *